United States Patent
Ooishi et al.

(10) Patent No.: US 6,603,217 B2
(45) Date of Patent: Aug. 5, 2003

(54) SEMICONDUCTOR CIRCUIT DEVICE HAVING HIERARCHICAL POWER SUPPLY STRUCTURE

(75) Inventors: Tsukasa Ooishi, Hyogo (JP); Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/967,939

(22) Filed: Oct. 2, 2001

(65) Prior Publication Data

US 2002/0017947 A1 Feb. 14, 2002

Related U.S. Application Data

(62) Division of application No. 09/301,359, filed on Apr. 29, 1999, now Pat. No. 6,313,695.

(30) Foreign Application Priority Data

Nov. 17, 1998 (JP) ............................................ 10-327058

(51) Int. Cl.[7] .................................................. H02J 1/00
(52) U.S. Cl. ............................ 307/29; 307/38; 307/85
(58) Field of Search .............................. 307/29, 38–41, 307/85–87, 18, 23–28

(56) References Cited

U.S. PATENT DOCUMENTS

| | | | |
|---|---|---|---|
| 5,583,457 A | 12/1996 | Horiguchi et al. | 327/544 |
| 5,608,275 A * | 3/1997 | Khosrowpour | 307/29 |
| 5,650,939 A * | 7/1997 | Yoshida | 307/38 |
| 5,659,517 A | 8/1997 | Arimoto et al. | 365/226 |
| 5,724,297 A | 3/1998 | Noda et al. | 365/226 |
| 5,726,946 A | 3/1998 | Yamagata et al. | 365/227 |
| 5,933,384 A | 8/1999 | Terada et al. | 365/227 |
| 5,942,808 A * | 8/1999 | Kaneko et al. | 307/29 |
| 5,959,368 A * | 9/1999 | Kubo et al. | 307/29 |
| 6,066,900 A * | 5/2000 | Chan et al. | 307/38 |
| 6,157,092 A * | 12/2000 | Hofmann | 307/39 |
| 6,313,695 B1 * | 11/2001 | Ooishi et al. | 327/544 |

FOREIGN PATENT DOCUMENTS

| | | | |
|---|---|---|---|
| JP | 6-203558 | 7/1994 | G11C/11/407 |

* cited by examiner

*Primary Examiner*—Fritz Fleming
(74) *Attorney, Agent, or Firm*—McDermott, Will & Emery

(57) ABSTRACT

Resistance elements are inserted into a main power supply line and a main ground line so that offset differential amplifiers receive voltages developed across the same. The differential amplifiers control transistors connected to a sub power supply line and a sub ground line. Thus, a leakage current flowing from the sub power supply line to the main ground line and that flowing from the main power supply line to the sub ground line are regularly kept constant. Consequently, it is possible to prevent an operation delay in an initial stage of a standby state while keeping an effect of reducing a subthreshold leakage current in a semiconductor circuit device having a hierarchical power supply structure.

4 Claims, 17 Drawing Sheets

SEMICONDUCTOR CIRCUIT DEVICE HAVING HIERARCHICAL POWER SUPPLY STRUCTURE

This application is a divisional of application Ser. No. 09/301,359 now U.S. Pat. No. 6,313,695 filed Apr. 29, 1999.

BACKGROUND OF THE INVENTION

1. Field of the Invention

The present invention relates to a semiconductor circuit device, and more particularly, it relates to a semiconductor circuit device having a hierarchical power supply structure according to an SCRC (subthreshold leakage current reduced control) technique.

2. Description of the Prior Art

A semiconductor circuit device having a hierarchical power supply structure is provided with a main power supply line and a sub power supply line, with a P-channel MOS transistor connected therebetween. The semiconductor circuit device is further provided with a main ground line and a sub ground line, with an N-channel MOS transistor connected therebetween. A logic circuit such as an invertor outputting a logical high-level signal in a standby state is connected between the main power supply line and the sub ground line, while a logic circuit such as an invertor outputting a logical low-level signal in the standby state is connected between the sub power supply line and the main ground line.

In an active state, both the P- and N-channel MOS transistors are turned on and hence the voltage of the sub power supply line reaches a power supply voltage identically to the main power supply line, while the voltage of the sub ground line reaches a ground voltage identically to the main ground line. Therefore, the aforementioned logic circuit outputs a high- or low-level signal in response to an input signal as general.

In the standby state, on the other hand, both the P- and N-channel MOS transistors are turned off and hence no power supply voltage is supplied to the sub power supply line and no ground voltage is supplied to the sub ground line. While the logic circuit connected to the main power supply line can normally output a high-level signal, a subthreshold current flowing in this logic circuit is reduced since the sub ground line is disconnected from the main ground line. While the logic circuit connected to the main ground line can normally output a low-level signal, a subthreshold leakage current flowing in this logic circuit is also reduced since the sub power supply line is disconnected from the main power supply line.

In the standby state, however, the sub power supply line and the sub ground line are disconnected from the main power supply line and the main ground line respectively and hence the voltage of the sub power supply line lowers to increase the potential difference between the main power supply line and the sub power supply line. Further, the voltage of the sub ground line increases to also increase the potential difference between the main ground line and the sub ground line. When the semiconductor circuit device shifts from the standby state to the active state and the sub power supply line is shorted to the main power supply line, therefore, it takes time for the voltage of the sub power supply line to reach the power supply voltage. Further, it also takes time for the voltage of the sub ground line to reach the ground voltage when the sub ground line is shorted to the main ground line. Consequently, the operating speed of the logic circuit is disadvantageously slowed down.

In order to solve this problem, U.S. Pat. No. 5,659,517 discloses a voltage set circuit for setting a sub power supply line at a reference voltage Vref1 while setting a sub ground line at a reference voltage Vref2. While this voltage set circuit can prevent a voltage drop of the sub power supply line and a voltage rise of the sub ground line in a standby state, a subthreshold leakage current flowing in a logic circuit disadvantageously increases. In other words, no sufficient effect of reducing the subthreshold leakage current can be attained by disconnecting the sub power supply line and the sub ground line from a main power supply line and a main ground line respectively.

U.S. Pat. No. 5,724,297 discloses a transistor for temporarily shorting a sub power supply line and a sub ground line when an internal circuit shifts from an active state to a standby state, in order to reduce current consumption. However, this gazette discloses no means for charging the sub power supply line and the sub ground line.

SUMMARY OF THE INVENTION

An object of the present invention is to provide a semiconductor circuit device which can prevent a voltage drop of a sub power supply line and a voltage rise of a sub ground line when shifting from a standby state to an active state while keeping an effect of reducing a subthreshold leakage current thereby preventing a logic circuit from an operation delay.

Another object of the present invention is to provide a semiconductor circuit device reducing power consumption.

According to an aspect of the present invention, a semiconductor circuit device having an active state and a standby state comprises a main power supply line, a sub power supply line, a first switching element, a main ground line, a sub ground line, a second switching element, a first logic circuit, a second logic circuit, a first constant current circuit and a second constant current circuit. The main power supply line receives a power supply voltage. The first switching element is connected between the main power supply line and the sub power supply line, turned on in the active state and turned off in the standby state. The main ground line receives a ground voltage. The second switching element is connected between the main ground line and the sub ground line, turned on in the active state and turned off in the standby state. The first logic circuit is connected between the main power supply line and the sub ground line, and outputs a logical high level in the standby state. The second logic circuit is connected between the sub power supply line and the main ground line, and outputs a logical low level in the standby state. The first constant current circuit supplies a constant current to the sub power supply line. The second constant current circuit supplies a constant current to the sub ground line.

In this semiconductor circuit device, the sub power supply line is supplied with the constant current, whereby the voltage thereof does not remarkably drop below the power supply voltage even in the standby state. Further, this current is so constant that a subthreshold leakage current flowing in the second logic circuit does not increase beyond necessity. The sub ground line is also supplied with the constant current, whereby the voltage thereof does not remarkably rise from the ground voltage. Further, this current is also constant and hence a subthreshold leakage current flowing in the first logic circuit does not increase beyond necessity. Consequently, the semiconductor circuit device can be prevented from a delay of the operating speed in an initial stage of the active state while suppressing increase of current consumption.

Preferably, the first constant current circuit includes a first charge circuit, a first monitor circuit and a first control circuit. The first charge circuit charges the sub power supply line. The first monitor circuit monitors a current supplied from the first charge circuit to the sub power supply line. The first control circuit so controls the first charge circuit as to keep the current monitored by the first monitor circuit constant. The second constant current circuit includes a second charge circuit, a second monitor circuit and a second control circuit. The second charge circuit charges the sub ground line. The second monitor circuit monitors a current supplied from the second charge circuit to the sub ground line. The second control circuit so controls the second charge circuit as to keep the current monitored by the second monitor circuit constant.

More preferably, the first monitor circuit includes a first resistance element inserted into the main ground line. The first control circuit includes a first differential amplifier receiving a voltage developed across the first resistance element and having an offset voltage. The first charge circuit includes a first transistor having a gate receiving an output voltage of the first differential amplifier. The second monitor circuit includes a second resistance element inserted into the main power supply line. The second control circuit includes a second differential amplifier receiving a voltage developed across the second resistance element and having an offset voltage. The second charge circuit includes a second transistor having a gate receiving an output voltage of the second differential amplifier.

Alternatively, the first monitor circuit includes a first resistance element inserted into the sub power supply line. The first control circuit includes a first differential amplifier receiving a voltage developed across the first resistance element and having an offset voltage. The first charge circuit includes a first transistor having a gate receiving an output voltage of the first differential amplifier. The second monitor circuit includes a second resistance element inserted into the sub ground line. The second control circuit includes a second differential amplifier receiving a voltage developed across the second resistance element and having an offset voltage. The second charge circuit includes a second transistor having a gate receiving an output voltage of the second differential amplifier.

In this semiconductor circuit device, the first resistance element monitors the current flowing from the sub power supply line to the main ground line and the charge of the sub power supply line is so controlled that this current is constant. Consequently, the charge current for the sub power supply line can be regularly kept constant. Further, the second resistance element monitors the current flowing from the main power supply line to the sub ground line, and the charge of the sub ground line is so controlled that this current is constant. Consequently, the charge current for the sub ground line can be regularly kept constant.

Preferably, the semiconductor circuit device further comprises a short circuit for shorting the sub power supply line and the sub ground line in the standby state.

In the aforementioned semiconductor circuit device, the sub power supply line is shorted to the sub ground line in the standby state, whereby the discharge current for the sub power supply line is utilized as the charge current for the sub ground line. Consequently, current consumption can be reduced.

According to another aspect of the present invention, a semiconductor circuit device having an active state and a standby state comprises a main power supply line, a sub power supply line, a switching P-channel MOS transistor, a main ground line, a sub ground line, a switching N-channel MOS transistor, a first logic circuit, a second logic circuit, a first back gate voltage supply circuit and a second back gate voltage supply circuit. The main power supply line receives a power supply voltage. The switching P-channel MOS transistor is connected between the main power supply line and the sub power supply line, turned on in the active state and turned off in the standby state. The main ground line receives a ground voltage. The switching N-channel MOS transistor is connected between the main ground line and the sub ground line, turned on in the active state and turned off in the standby state. The first logic circuit is connected between the main power supply line and the sub ground line, and outputs a logical high level in the standby state. The second logic circuit is connected between the sub power supply line and the main ground line, and outputs a logical low level in the standby state. The first back gate voltage supply circuit supplies the power supply voltage to a back gate of the switching P-channel MOS transistor in the active state, while supplying a voltage higher than the power supply voltage to the back gate of the switching P-channel MOS transistor in the standby state. The second back gate voltage supply circuit supplies the ground voltage to a back gate of the switching N-channel MOS transistor in the active state, while supplying a voltage lower than the ground voltage to the back gate of the switching N-channel MOS transistor.

In the aforementioned semiconductor circuit device, the power supply voltage is supplied to the back gate of the P-channel MOS transistor and the ground voltage is supplied to the back gate of the N-channel MOS transistor in the active state, whereby a substrate effect is reduced and the operating speeds of these transistors are increased as a result. In the standby state, on the other hand, the voltage higher than the power supply voltage is supplied to the back gate of the P-channel MOS transistor and the voltage lower than the ground voltage is supplied to the back gate of the N-channel MOS transistor, whereby the substrate effect is increased and subthreshold leakage currents of these transistors are reduced as a result.

According to still another aspect of the present invention, a semiconductor circuit device includes a first hierarchical block and a plurality of second hierarchical blocks. The first hierarchical block includes a first power supply system, a first receiving circuit and a plurality of first transmission circuits. The first power supply system supplies a prescribed voltage to an internal circuit in the first hierarchical block. The first receiving circuit receives an externally supplied first request signal and activates the first power supply system. The plurality of first transmission circuits are disposed in correspondence to the plurality of second hierarchical blocks respectively. Each of the first transmission circuits transmits a second request signal to the second hierarchical block corresponding thereto. Each of the second hierarchical blocks includes a second power supply line and a second receiving circuit. The second power supply system supplies a prescribed voltage to an internal circuit in the second hierarchical block. The second receiving circuit receives a second request signal and activates the second power supply system.

In the aforementioned semiconductor circuit device, the first power supply system is activated in response to the externally supplied first request signal, and then the second power supply system is activated in response to the second request signal from the first hierarchical block. Consequently, no unnecessary power supply system is activated but power consumption can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
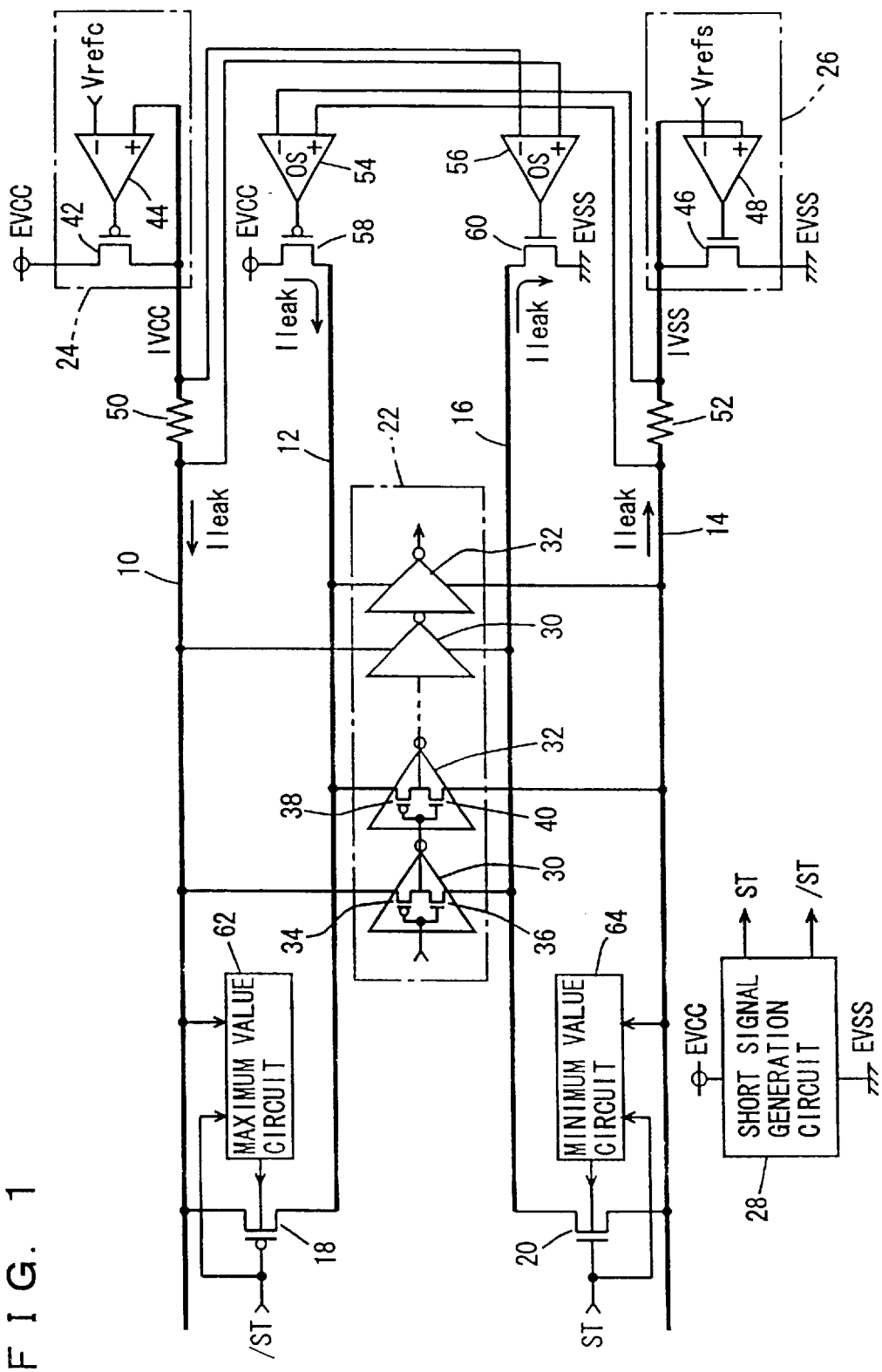
FIG. 1 is a circuit diagram showing the structure of a semiconductor circuit device according to an embodiment 1 of the present invention.

Embodiments of the present invention are now described in detail with reference to the drawings. Referring to the drawings, identical or corresponding parts are denoted by the same reference numerals, to omit redundant description.

Embodiment 1

FIG. 1 is a circuit diagram showing the structure of a semiconductor circuit device according to an embodiment 1 of the present invention. Referring to FIG. 1, this semiconductor circuit device includes a main power supply line 10, a sub power supply line 12, a main ground line 14, a sub ground line 16, a P-channel MOS transistor 18, an N-channel MOS transistor 20, an internal circuit 22, a voltage down converter (VDC) 24, a voltage up converter (VUC) 26 and a short signal generation circuit 28.

This semiconductor circuit device has an active state for performing general operations and a standby state for performing minimum necessary operations in a low power consumption mode such as a power down mode or a self-refresh mode. The P-channel MOS transistor 18, which is a switching element turned on in the active state and turned off in the standby state, is connected between the main power supply line 10 and the sub power supply line 12. The N-channel MOS transistor 20, which is a switching element turned on in the active state and turned off in the standby state, is connected between the main ground line 14 and the sub ground line 16.

The internal circuit 22 includes a number of invertors 30 and 32. The internal circuit 22 further includes a number of logic circuits such as NAND gates or NOR gates, and these interconnected logic circuits perform prescribed operations. Each invertor 30 includes a P-channel MOS transistor 34 and an N-channel MOS transistor 36, and the source of the transistor 34 is connected to the main power supply line 10 while that of the transistor 36 is connected to the sub ground line 16. Each invertor 32 includes a P-channel MOS transistor 38 and an N-channel MOS transistor 40, and the source of the transistor 38 is connected to the sub power supply line 12 while that of the transistor 40 is connected to the main ground line 14. The invertors 30 and 32 output high- or low-level signals in response to an input signal during the active period as general, while the invertor 30 outputs a high-level signal in response to a low-level input signal and the invertor 32 outputs a low-level signal in response to a high-level input signal during the standby period. During the standby period, a NAND gate or NOR gate connected between the main power supply line 10 and the sub ground line 16 outputs a high-level signal, and a NAND gate or NOR gate connected between the sub power supply line 12 and the main ground line 14 outputs a low-level signal.

The voltage down convertor 24 includes a P-channel MOS transistor 42 for driving and a differential amplifier 44, and supplies, on the basis of an external power supply voltage EVCC, a lower internal power supply voltage IVCC to the main power supply line 10. Therefore, the differential amplifier 44 so controls the transistor 42 that the internal power supply voltage IVCC is equal to a reference voltage Vrefc. The voltage up convertor 26 includes an N-channel MOS transistor 46 for driving and a differential amplifier 48, and supplies, on the basis of an external ground voltage EVSS, a higher internal ground voltage IVSS to the main ground line 14. Therefore, the differential amplifier 48 so controls the transistor 46 that the internal ground voltage IVSS is equal to a reference voltage Vrefs.

Figure 2:
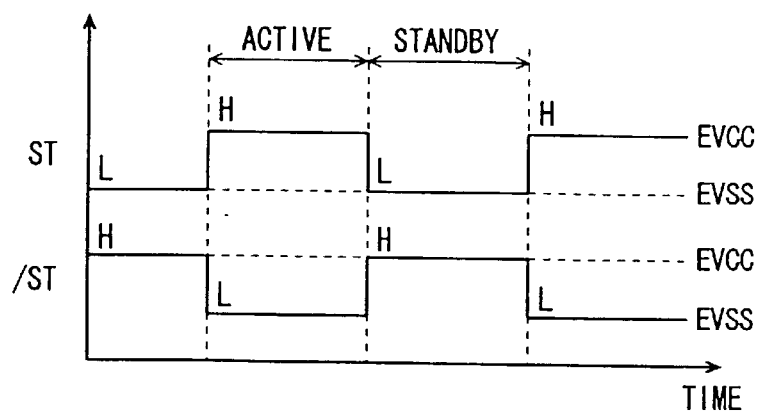
FIG. 2 is a timing chart showing operations of a short signal generation circuit shown in FIG. 1.

The short signal generation circuit 28 generates a short signal ST and a short signal /ST complementary thereto, and supplies the short signal IST to the gate of the P-channel MOS transistor 18 while supplying the short signal ST to the gate of the N-channel MOS transistor 20. The short signal ST changes to a high level in the active period and changes to a low level in the standby period, as shown in FIG. 2. On the contrary, the short signal /ST changes to a low level in the active period and changes to a high level in the standby period. The high level of the short signal ST corresponds to the external power supply voltage EVCC, and the low level thereof corresponds to the external ground voltage EVSS. The low level of the short signal /ST corresponds to the external ground voltage EVSS, and the high level thereof corresponds to the external power supply voltage EVCC.

In the active state, therefore, the transistor 18 is turned on in response to the low-level short signal /ST, whereby the sub power supply line 12 is shorted to the main power supply line 10. Further, the transistor 20 is turned on in response to the high-level short signal ST, whereby the sub ground line 16 is shorted to the main ground line 14. Thus, the voltage of the sub power supply line 12 reaches the internal power supply voltage IVCC identically to the main power supply line 10, and that of the sub ground line 16 reaches the internal ground voltage IVSS identically to the main ground line 14. Consequently, the internal circuit 22 operates as general.

In the standby state, on the other hand, the transistor 18 is turned off in response to the high-level short signal /ST, whereby the sub power supply line 12 is disconnected from the main power supply line 10. Further, the transistor 20 is turned off in response to the low-level short signal ST, whereby the sub ground line 16 is disconnected from the main ground line 14. Therefore, the invertor 30, which is not supplied with the internal ground voltage IVSS but receives a low-level input signal in the standby state, can output a normal high-level signal corresponding to the internal power supply voltage IVCC. Further, the invertor 32, which is not supplied with the internal power supply voltage IVCC but receives a high-level input signal in the standby state, can output a normal low-level signal corresponding to the internal ground voltage IVSS.

In such a standby state, the sub power supply line 12 is disconnected from the main power supply line 10, whereby a subthreshold leakage current flowing in the P-channel MOS transistor 38 in the invertor 32 is reduced. Further, the sub ground line 16 is disconnected from the main ground line 14, whereby a subthreshold leakage current flowing in the N-channel MOS transistor 36 in the invertor 30 is reduced.

The voltage of the sub power supply line 12, which is equal to the internal power supply voltage IVCC immediately after the semiconductor circuit device shifts from the active state to the standby state, lowers due to the subthreshold leakage current of the transistor 38 in the invertor 32. Further, the voltage of the sub ground line 16, which is equal to the internal ground voltage IVSS, rises due to the subthreshold leakage current of the transistor 36 in the invertor 30. If the voltage of the sub power supply line 12 excessively lowers and that of the sub ground line 16 excessively rises, the internal circuit 22 cannot immediately operate when the semiconductor circuit device shifts from the standby state to the active state, as described above.

In order to prevent the internal circuit 22 from such an operation delay, the semiconductor circuit device further includes resistance elements 50 and 52, offset differential amplifiers 54 and 56, a P-channel MOS transistor 58 and an N-channel MOS transistor 60.

The resistance element 52, the transistor 58 and the differential amplifier 54 form a constant current circuit for supplying a constant current to the sub power supply line 12. The resistance element 50, the transistor 60 and the differential amplifier 56 form a constant current circuit for supplying a constant current to the sub ground line 16.

The resistance element 52 is inserted into the main ground line 14, and monitors a current supplied from the transistor 58 to the sub power supply line 12. The resistance element 50 is inserted into the main power supply line 10, and monitors a current (negative) supplied from the transistor 60 to the sub ground line 16. The resistance elements 50 and 52 may not necessarily be formed by actual resistors inserted into intermediate portions of aluminum wires forming the main power supply line 10 and the main ground line 14, but may be formed by parts of the aluminum wires.

The differential amplifier 54, which receives a voltage developed across the resistance element 52 and has an offset voltage, so controls the transistor 58 as to keep the current monitored by the resistance element 52 constant. The differential amplifier 56, which receives a voltage developed across the resistance element 50 and has an offset voltage, so controls the transistor 60 as to keep the current monitored by the resistance element 50 constant.

The transistor 58 has a source receiving the external power supply voltage EVCC, a drain connected to the sub power supply line 12 and a gate receiving an output voltage of the differential amplifier 54, and charges the sub power supply line 12. The transistor 60 has a source receiving the external ground voltage EVSS, a drain connected to the sub ground line 16 and a gate receiving an output voltage of the differential amplifier 56, and discharges the sub ground line 16.

In the standby state, as described above, a leakage current Ileak flows from the sub power supply line 12 to the main ground line 14 through the invertor 32. This leakage current Ileak is equal to the subthreshold leakage current flowing in the P-channel MOS transistor 38 in the invertor 32. A leakage current Ileak also flows from the main power supply line 10 to the sub ground line 16 through the invertor 30. This leakage current Ileak is equal to the total subthreshold leakage current flowing in the N-channel MOS transistor 36 in the invertor 30.

Assuming that the leakage current Ileak flowing from the sub power supply line 12 to the main ground line 14 increases, the voltage developed across the resistance element 52 increases and the differential amplifier 54 responsively operates to turn off the transistor 58. Assuming that the leakage current Ileak reduces on the contrary, the voltage developed across the resistance element 52 reduces and the differential amplifier 54 responsively operates to turn on the transistor 58. Consequently, it follows that the transistor 58 regularly supplies a constant leakage current Ileak to the sub power supply line 12.

Assuming that the leakage current Ileak flowing from the main power supply line 10 to the sub ground line 16 increases, on the other hand, the voltage developed across the resistance element 50 increases and the differential amplifier 56 responsively operates to turn off the transistor 60. Assuming that this leakage current Ileak reduces on the contrary, the voltage developed across the resistance element 50 reduces and the differential amplifier 56 responsively operates to turn on the transistor 60. Consequently, it follows that the transistor 60 regularly extracts a constant leakage current Ileak from the sub ground line 16.

Assuming that R represents the value of the resistance element 50 or 52 and Voff represents the offset voltage of the differential amplifier 54 or 56, the leakage current Ileak is expressed as follows:

$$Ileak = Voff/R \quad (1)$$

As understood from the equation (1), the offset voltage Voff and the value R are constant and hence the leakage current Ileak is also constant. Thus, the leakage current Ileak equal to the total subthreshold leakage current flowing in the invertor 32 is stationarily supplied to the sub power supply line 12, whereby the voltage of the sub power supply line 12 does not remarkably drop during the standby period. Further, the leakage current Ileak equal to the total subthreshold current flowing in the invertor 30 is stationarily extracted from the sub ground line 16, whereby the voltage of the sub ground line 16 does not remarkably rise during the standby period. Consequently, the internal circuit 22 can immediately perform a normal operation when the semiconductor circuit device shifts from the standby state to the active state.

EXAMPLE OF OFFSET DIFFERENTIAL AMPLIFIER

Figure 3:
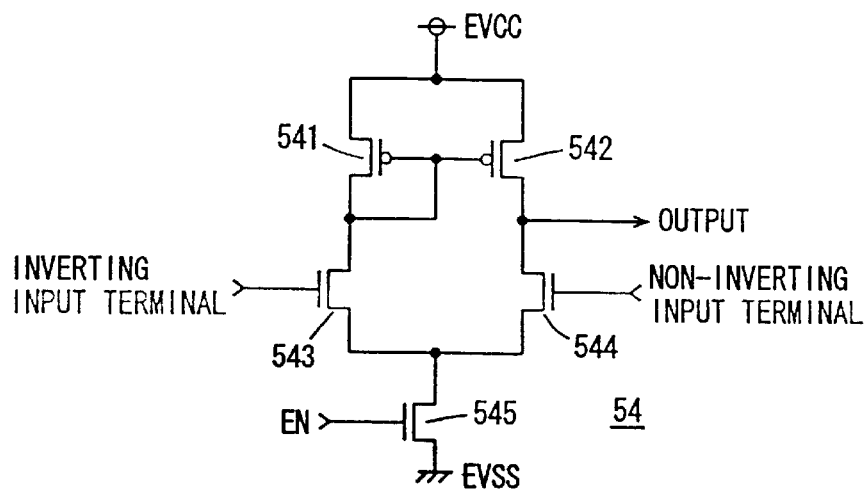
FIG. 3 is a circuit diagram showing the structure of an offset differential amplifier shown in FIG. 1.

FIG. 3 is a circuit diagram showing an example of the offset differential amplifier 54 shown in FIG. 1. Referring to FIG. 3, this differential amplifier 54 includes P-channel MOS transistors 541 and 542 and N-channel MOS transistors 543 to 545. The threshold voltage of the transistor 543 is rendered greater than that of the transistor 544. This difference between the threshold voltages forms the offset voltage Voff. The gate of the transistor 545 is supplied with a chip enable signal EN going high during an operation of the semiconductor circuit device.

Figure 4:
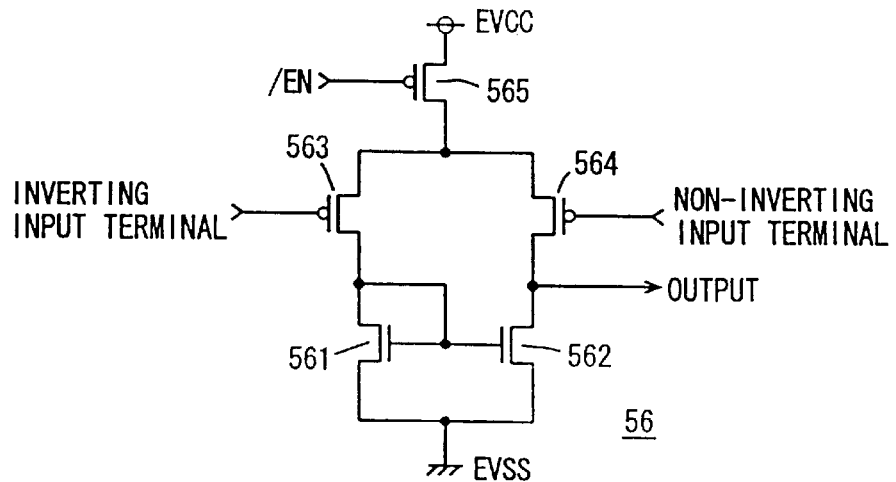
FIG. 4 is a circuit diagram showing the structure of another offset differential amplifier shown in FIG. 1.

FIG. 4 is a circuit diagram showing an example of the offset differential amplifier 56 shown in FIG. 1. Referring to FIG. 4, this differential amplifier 56 includes N-channel MOS transistors 561 and 562 and P-channel MOS transistors 563 to 565. The threshold voltage of the transistor 563 is rendered greater than that of the transistor 564. This difference between the threshold voltages forms the offset voltage Voff. The gate of the transistor 565 is supplied with a chip enable signal /EN complementary to the chip enable signal EN.

In this semiconductor circuit device, the high-level short signal /ST, i.e., the external power supply voltage EVCC is supplied to the gate of the P-channel MOS transistor 18 and the low-level short signal ST, i.e., the external ground voltage EVSS is supplied to the gate of the N-channel MOS transistor in the standby state. In the transistor 18, therefore, the gate voltage (EVCC) is higher than the source voltage (IVCC), whereby a subthreshold leakage current hardly flows in the transistor 18. In the transistor 20, further, the gate voltage (EVSS) is lower than the source voltage (IVSS), whereby a subthreshold leakage current hardly flows in the transistor 20. Consequently, the leakage current Ileak flowing in the sub power supply line 12 or the sub ground line 16 in the standby state is formed only by a subthreshold leakage current flowing in the internal circuit 22.

In order to reduce the subthreshold leakage currents of the transistors 18 and 20, the semiconductor circuit device further includes a maximum value circuit 62 and a minimum value circuit 64.

The maximum value circuit 62, which is connected to the main power supply line 10 and the gate of the P-channel MOS transistor 18, selects the higher one of the internal power supply voltage IVCC of the main power supply line 10 and the gate voltage of the transistor 18 and supplies the same to the back gate of the transistor 18. In the active state, the external ground voltage EVSS is supplied to the gate of the transistor 18 and hence the maximum value circuit 62 supplies the internal power supply voltage IVCC to the back gate of the transistor 18. In the standby state, on the other hand, the external power supply voltage EVCC is supplied to the gate of the transistor 18 and hence the maximum value circuit 62 supplies the external power supply voltage EVCC, which is higher than the internal power supply voltage IVCC, to the back gate of the transistor 18.

Even if the voltage of the main power supply line 10 drops below that of the sub power supply line 12 during the active period, therefore, a p-n junction between a p-type diffusion region forming the source and the drain and a p-type substrate region forming the back gate is not forward-biased. During the standby period, on the other hand, the external power supply voltage EVCC is supplied to the back gate, whereby a substrate effect is increased to further reduce the subthreshold leakage current.

The minimum value circuit 64, which is connected to the main ground line 14 and the gate of the N-channel MOS transistor 20, selects the lower one of the internal ground voltage IVSS of the main ground line 14 and the gate voltage of the transistor 20 and supplies the same to the back gate of the transistor 20. In the active state, the external power supply voltage EVCC is supplied to the gate of the transistor 20 and hence the minimum value circuit 64 supplies the internal ground voltage IVSS to the back gate of the transistor 20. In the standby state, on the other hand, the external ground voltage EVSS is supplied to the gate of the transistor 20 and hence the minimum value circuit 64 supplies the external ground voltage EVSS, which is lower than the internal ground voltage IVSS, to the back gate of the transistor 20.

Even if the voltage of the main ground line 14 increases beyond that of the sub ground line 16 during the active period, therefore, a p-n junction between a p-type substrate region forming the back gate and an n-type diffusion region forming the source and the drain is not forward-biased, similarly to the above. During the standby period, on the other hand, the external ground voltage EVSS is supplied to the back gate of the transistor 20, and hence a substrate effect is increased to further reduce the subthreshold leakage current.

EXAMPLE OF MAXIMUM VALUE CIRCUIT

Figure 5:
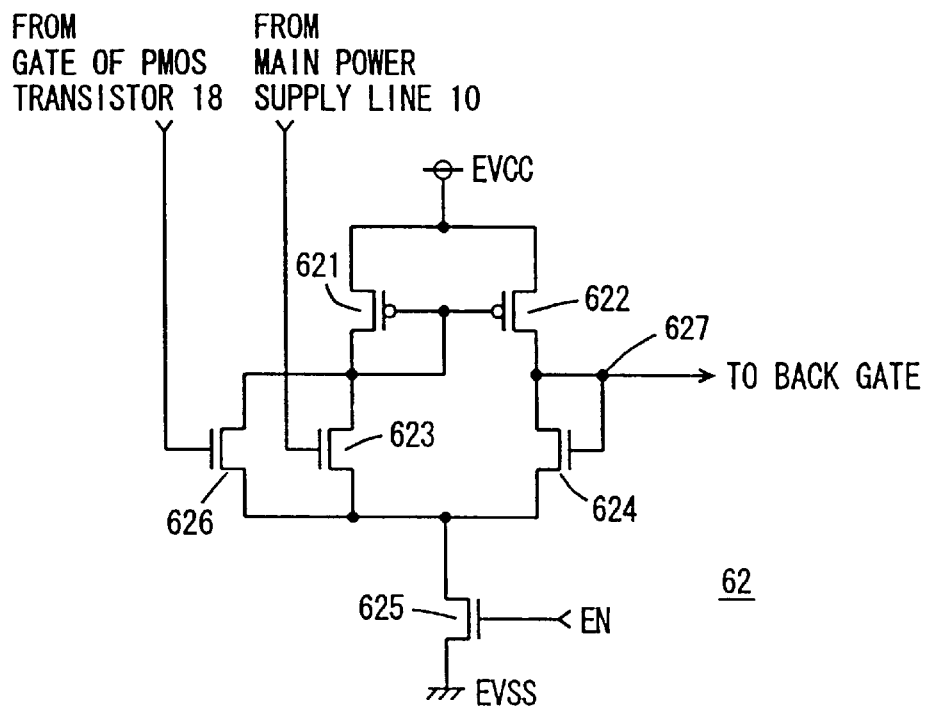
FIG. 5 is a circuit diagram showing an example of a maximum value circuit shown in FIG. 1.

FIG. 5 is a circuit diagram showing an example of the maximum value circuit 62 shown in FIG. 1. Referring to FIG. 5, this maximum value circuit 62 includes a differential amplifier formed by P-channel MOS transistors 621 and 622 and N-channel MOS transistors 623 to 625 and an N-channel MOS transistor 626 connected in parallel with one input transistor 623 of the differential amplifier. The gate of the input transistor 623 is connected to the main power supply line 10, and that of another input transistor 624 is connected to an output node 627 of the maximum value circuit 62. The gate of the transistor 626 is connected to that of the transistor 18. The gate of the transistor 625 is supplied with the chip enable signal EN.

During the active period, the external ground voltage EVSS is supplied to the gate of the transistor 626, which is turned off to be unfunctional. Therefore, the maximum value circuit 62 outputs a voltage equal to the internal power supply voltage IVCC supplied from the main power supply line 10 to the gate of the transistor 623.

During the standby period, on the other hand, the external power supply voltage EVCC is supplied to the gate of the transistor 626, and hence the transistor 623 receiving the lower internal power supply voltage IVCC hardly functions. Consequently, the maximum value circuit 62 outputs a voltage substantially equal to the external power supply voltage EVCC. While the voltage outputted in the standby state is slightly lower than the external power supply voltage EVCC in the strict sense, this voltage is higher than the internal power supply voltage IVCC and hence the subthreshold leakage current of the transistor 18 is sufficiently reduced.

EXAMPLE OF MINIMUM VALUE CIRCUIT

Figure 6:
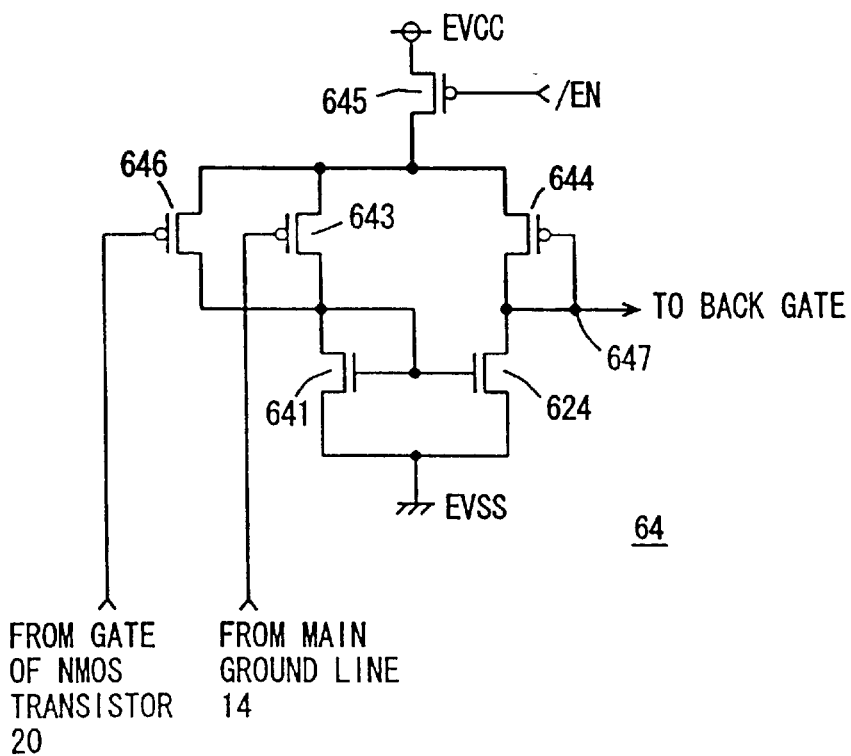
FIG. 6 is a circuit diagram showing an example of a minimum value circuit shown in FIG. 1.

FIG. 6 is a circuit diagram showing an example of the minimum value circuit 64 shown in FIG. 1. Referring to FIG. 6, this minimum value circuit 64 includes a differential amplifier formed by N-channel MOS transistors 641 and 642 and P-channel MOS transistors 643 to 645 and a P-channel MOS transistor 646 connected in parallel with one input transistor 643. The gate of the input transistor 643 is connected to the main ground line 14, and that of another input transistor 644 is connected to an output node 647 of the minimum value circuit 64. The gate of the transistor 646 is connected to that of the transistor 20. The gate of the transistor 645 is supplied with the chip enable signal /EN.

During the active period, the external power supply voltage EVCC is supplied to the gate of the transistor 646, which is turned off to be unfunctional. Consequently, the minimum value circuit 64 outputs a voltage equal to the internal ground voltage IVSS supplied from the main ground line 14 to the gate of the transistor 643.

During the standby period, on the other hand, the external ground voltage EVSS is supplied to the gate of the transistor 646 and hence the transistor 643 receiving the higher internal ground voltage IVSS hardly functions. Consequently, the minimum value circuit 64 outputs a voltage substantially equal to the external ground voltage EVSS. While the voltage outputted in the standby state is slightly higher than the external ground voltage EVSS in the strict sense, this voltage is lower than the internal ground voltage IVSS and hence the subthreshold leakage current of the transistor 20 is sufficiently reduced.

ANOTHER EXAMPLE OF MAXIMUM VALUE CIRCUIT

Figure 7:
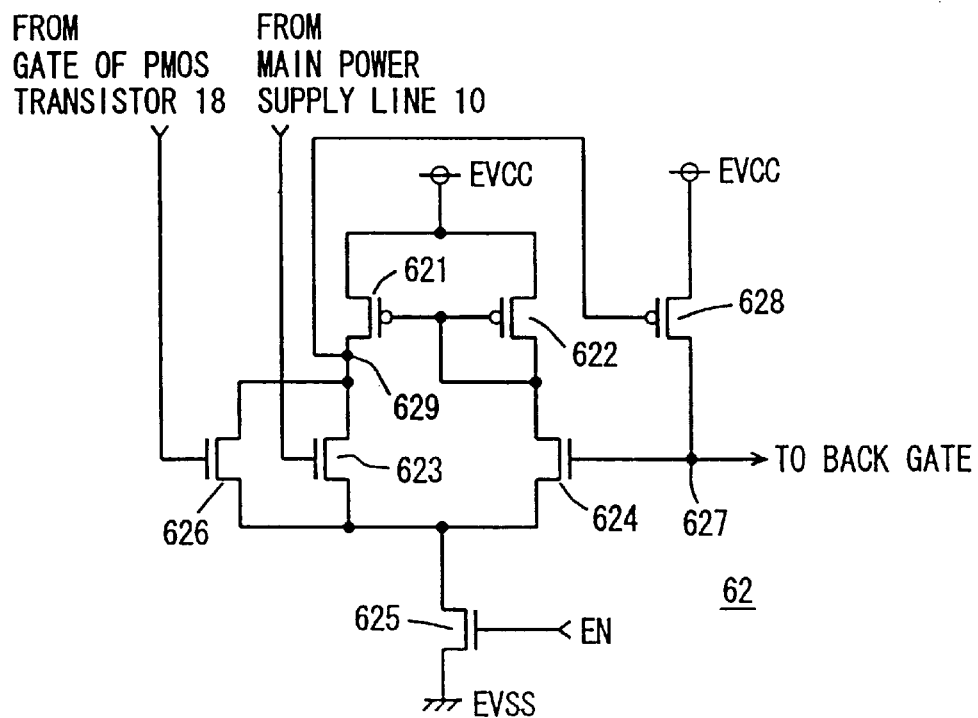
FIG. 7 is a circuit diagram showing another example of the maximum value circuit shown in FIG. 1.

FIG. 7 is a circuit diagram showing another example of the maximum value circuit 62 shown in FIG. 1. Referring to FIG. 7, this maximum value circuit 62 includes a P-channel MOS transistor 628 for driving, in addition to the structure shown in FIG. 5. This transistor 628 has a source receiving the external power supply voltage EVCC higher than the internal power supply voltage IVCC, a drain connected to an output node 627 of the maximum value circuit 62 and a gate connected to an output node 629 of a differential amplifier (621 to 625).

The maximum value circuit 62 shown in FIG. 7, including the transistor 628 for driving, has higher drivability than the maximum value circuit 62 shown in FIG. 5.

ANOTHER EXAMPLE OF MINIMUM VALUE CIRCUIT

Figure 8:
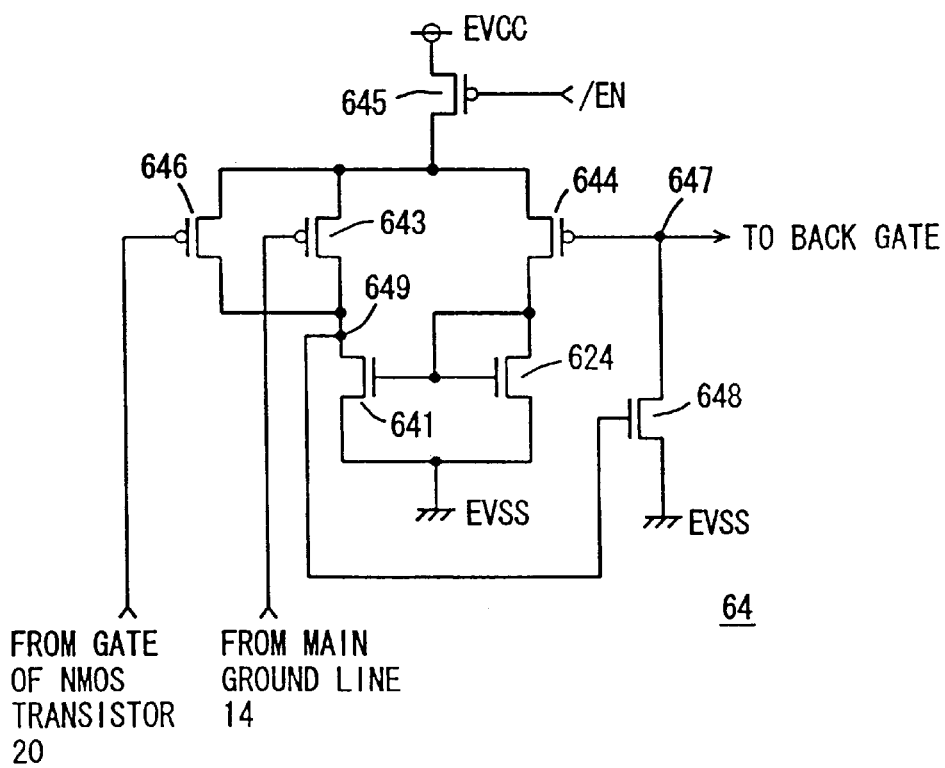
FIG. 8 is a circuit diagram showing another example of the minimum value circuit shown in FIG. 1.

FIG. 8 is a circuit diagram showing another example of the minimum value circuit 64 shown in FIG. 1. Referring to FIG. 8, this minimum value circuit 64 includes an N-channel MOS transistor 648 for driving, in addition to the structure shown in FIG. 6. This transistor 648 has a source receiving the external ground voltage EVSS lower than the internal ground voltage IVSS, a drain connected to an output node 647 of the minimum value circuit 64, and a gate connected to an output node 649 of a differential amplifier (641 to 645).

The minimum value circuit 64 shown in FIG. 8, including the transistor 648 for driving, has higher drivability than the minimum value circuit 64 shown in FIG. 6.

STILL ANOTHER EXAMPLE OF MAXIMUM VALUE CIRCUIT

Figure 9:
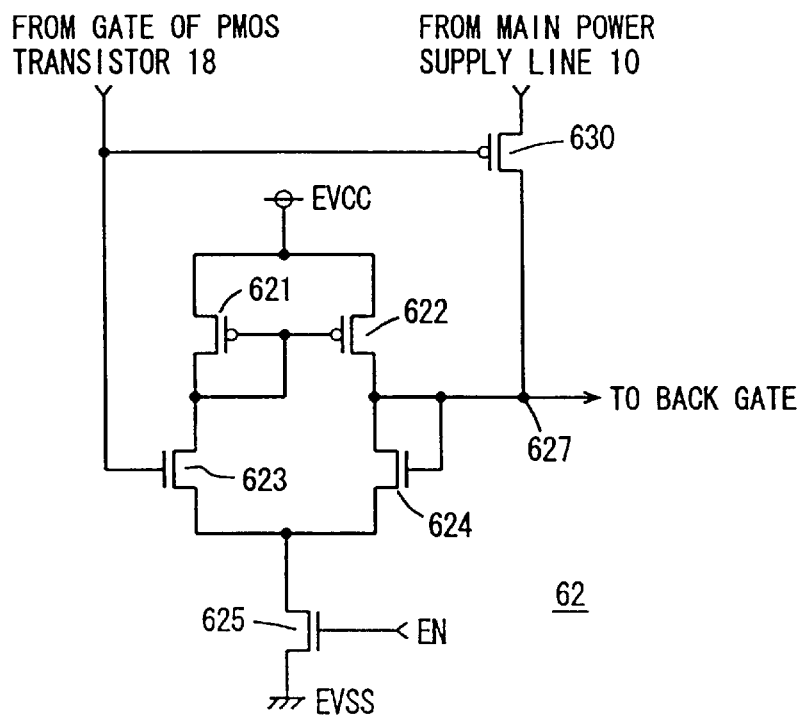
FIG. 9 is a circuit diagram showing still another example of the maximum value circuit shown in FIG. 1.

FIG. 9 is a circuit diagram showing still another example of the maximum value circuit 62 shown in FIG. 1. Referring to FIG. 9, this maximum value circuit 62 includes no transistor 626 shown in FIG. 5 but substitutionally includes a P-channel MOS transistor 630 for shorting. The gate of one input transistor 623 of a differential amplifier (621 to 625) is connected to the gate of the transistor 18. The transistor 630 is connected between an output node 627 of the maximum value circuit 62 and the main power supply line 10. The gate of the transistor 630 is connected to that of the transistor 18.

During the active period, the external ground voltage EVSS is supplied to the gates of the transistors 623 and 630, whereby the transistor 630 is turned on and the maximum value circuit 62 outputs the internal power supply voltage IVCC supplied from the main power supply line 10.

During the standby period, on the other hand, the external power supply voltage EVCC is supplied to the gates of the transistors 623 and 630, whereby the transistor 630 is turned off. Consequently, the maximum value circuit 62 outputs a voltage equal to the external power supply voltage EVCC.

The maximum value circuit 62 shown in FIG. 9, including the transistor 630 for shorting, can quickly supply the internal power supply voltage IVCC to the back gate of the transistor 18 during the active period.

STILL ANOTHER EXAMPLE OF MINIMUM VALUE CIRCUIT

Figure 10:
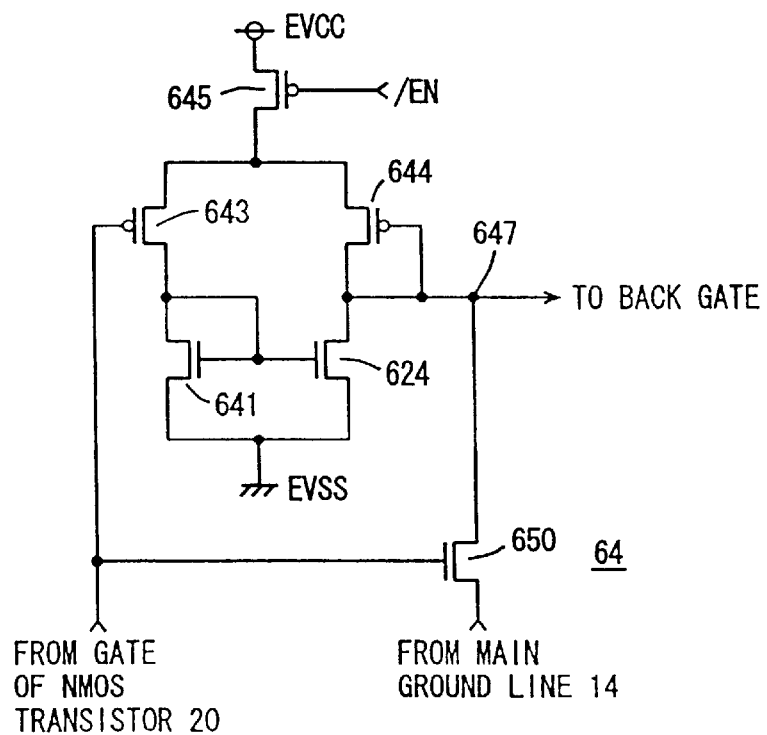
FIG. 10 is a circuit diagram showing still another example of the minimum value circuit shown in FIG. 1.

FIG. 10 is a circuit diagram showing still another example of the minimum value circuit 64 shown in FIG. 1. Referring to FIG. 10, this minimum value circuit 64 includes no transistor 646 shown in FIG. 6 but substitutionally includes an N-channel MOS transistor 650 for shorting. The gate of one input transistor 643 of a differential amplifier (641 to 645) is connected to the gate of the transistor 20. The transistor 650 is connected between an output node 647 of the minimum value circuit 64 and the main ground line 14. The gate of the transistor 650 is connected to that of the transistor 20.

During the active period, the external power supply voltage EVCC is supplied to the gates of the transistors 643 and 650, whereby the transistor 650 is turned on. Consequently, the minimum value circuit 64 outputs the internal ground voltage IVSS supplied from the main ground line 14.

During the standby period, on the other hand, the external ground voltage EVSS is supplied to the gates of the transistors 643 and 650, whereby the transistor 650 is turned off. Consequently, the minimum value circuit 64 outputs a voltage equal to the external ground voltage EVSS.

The minimum value circuit 64 shown in FIG. 10, including the transistor 650 for shorting, can quickly supply the internal ground voltage IVSS to the back gate of the transistor 20 during the active period.

While the maximum value circuit and the minimum value circuit are employed in the embodiment 1, a third power supply other than the main power supply and the sub power supply may be employed as the maximum value or the minimum value in practice. The important point is to provide a structure capable of reducing the impedance of a switching transistor in an active state while increasing the same in a standby state.

Embodiment 2

Figure 11:
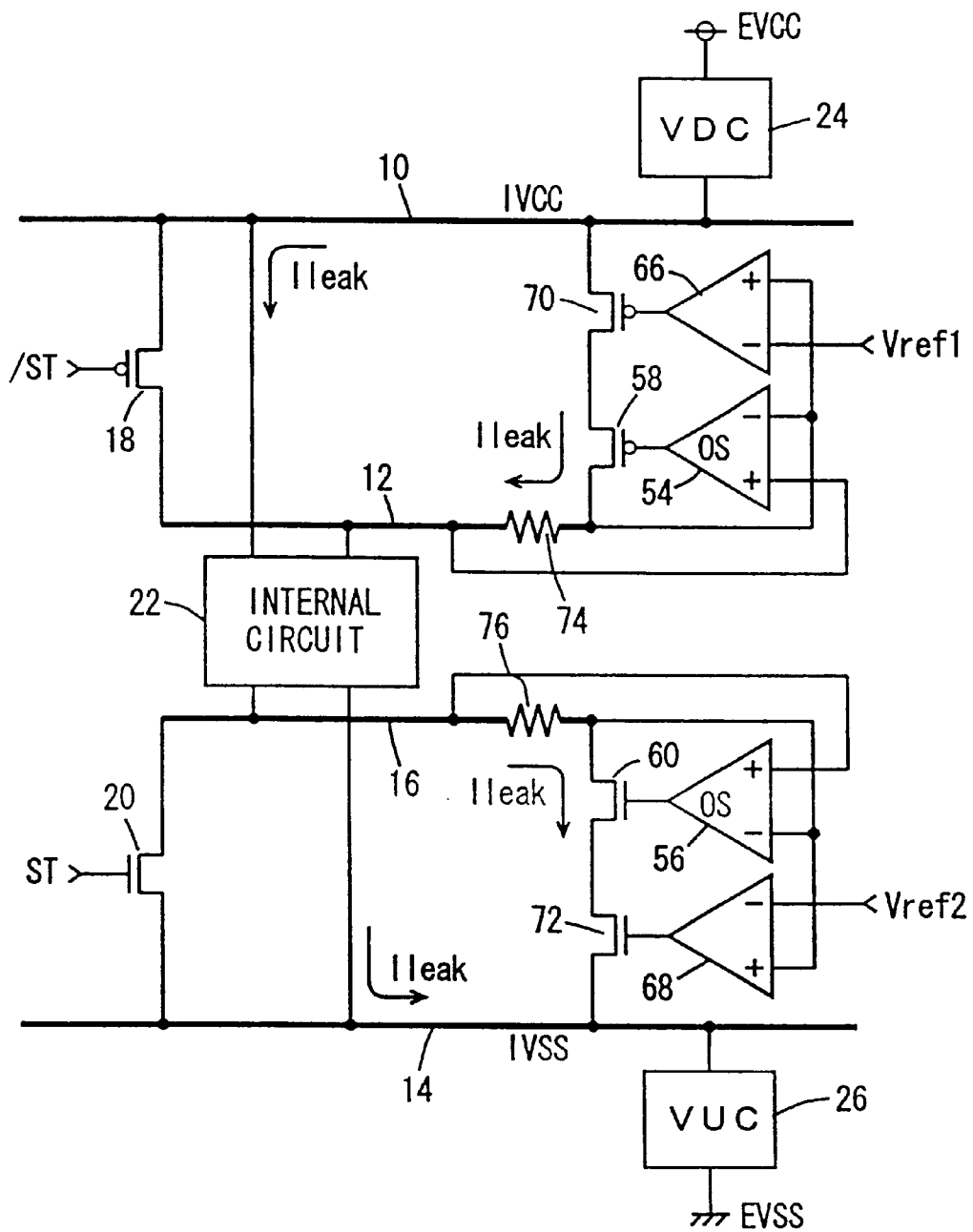
FIG. 11 is a circuit diagram showing the structure of a semiconductor circuit device according to an embodiment 2 of the present invention.

FIG. 11 is a circuit diagram showing the structure of a semiconductor circuit device according to an embodiment 2 of the present invention. Referring to FIG. 11, this semiconductor circuit device includes differential amplifiers 66 and 68, a P-channel MOS transistor 70 and an N-channel MOS transistor 72, in addition to the structure shown in FIG. 1.

The differential amplifier 66 so controls the transistor 70 that the voltage of a sub power supply line 12 is equal to a reference voltage Vref1. The differential amplifier 68 so controls the transistor 72 that the voltage of a sub ground line 16 is equal to a reference voltage Vref2.

In the embodiment 2, a resistance element 74 for monitoring a current supplied from a transistor 58 to the sub power supply line 12 is inserted not into a main ground line 14 but into the sub power supply line 12, dissimilarly to the embodiment 1. A voltage developed across the resistance element 74 is supplied to a differential amplifier 54 having an offset voltage. Therefore, this differential amplifier 54 so controls the transistor 58 as to keep a leakage current Ileak monitored by the resistance element 74 constant.

Further, a resistance element 76 for monitoring a current extracted from the sub ground line 16 to a transistor 60 is inserted not into a main power supply line 10 but into the sub ground line 16. A voltage developed across the resistance element 76 is supplied to a differential amplifier 56 having an offset voltage. Therefore, the differential amplifier 56 so controls the transistor 60 as to keep a leakage current Ileak monitored by the resistance element 76 constant.

According to the embodiment 2, a current corresponding to a total subthreshold leakage current flowing in an internal circuit 22 is stationarily supplied to the sub power supply line 12 and the sub ground line 16 even in a standby state, whereby the internal circuit 22 can be prevented from an operation delay in an initial stage of an active period similarly to the embodiment 1.

Embodiment 3

Figure 12:
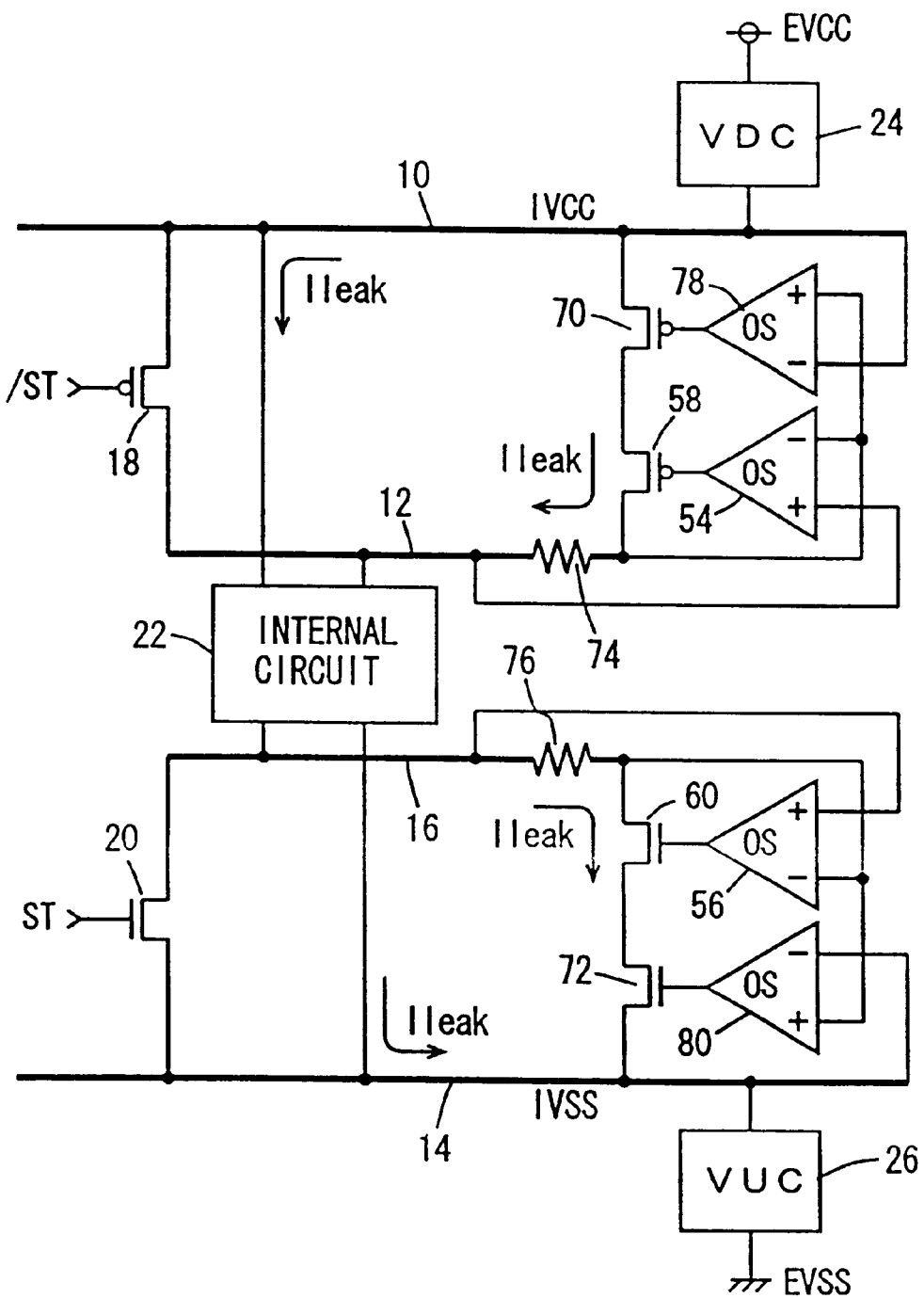
FIG. 12 is a circuit diagram showing the structure of a semiconductor circuit device according to an embodiment 3 of the present invention.

FIG. 12 is a circuit diagram showing the structure of a semiconductor circuit device according to an embodiment 3 of the present invention. Referring to FIG. 12, this semiconductor circuit device includes an offset differential amplifier 78 in place of the differential amplifier 66 shown in FIG. 11 and an offset differential amplifier 80 in place of the differential amplifier 68 shown in FIG. 11. An inverting amplifier terminal (−) of the differential amplifier 78 is supplied not with the reference voltage Vref1 shown in FIG. 11 but with an internal power supply voltage IVCC of a main power supply line 10. Further, an inverting amplifier terminal (−) of the differential amplifier 80 is supplied not with the reference voltage Vref2 shown in FIG. 11 but with an internal ground voltage IVSS of a main ground line 12. Therefore, the differential amplifier 78 so controls a transistor 70 that the potential difference between the main power supply line 10 and a sub power supply line 12 is equal to its offset voltage. Further, the differential amplifier 80 so controls a transistor 72 that the potential difference between the main ground line 14 and a sub ground line 16 is equal to its offset voltage.

According to the embodiment 3, the potential difference between the main power supply line 10 and the sub power supply line 12 is equal to the offset voltage of the differential amplifier 78 and the potential difference between the main ground line 14 and the sub ground line 16 is equal to the offset voltage of the differential amplifier 80 in a standby state, whereby these potential differences are kept constant even if an external power supply voltage EVCC or an external ground voltage EVSS fluctuates.

Embodiment 4

Figure 13:
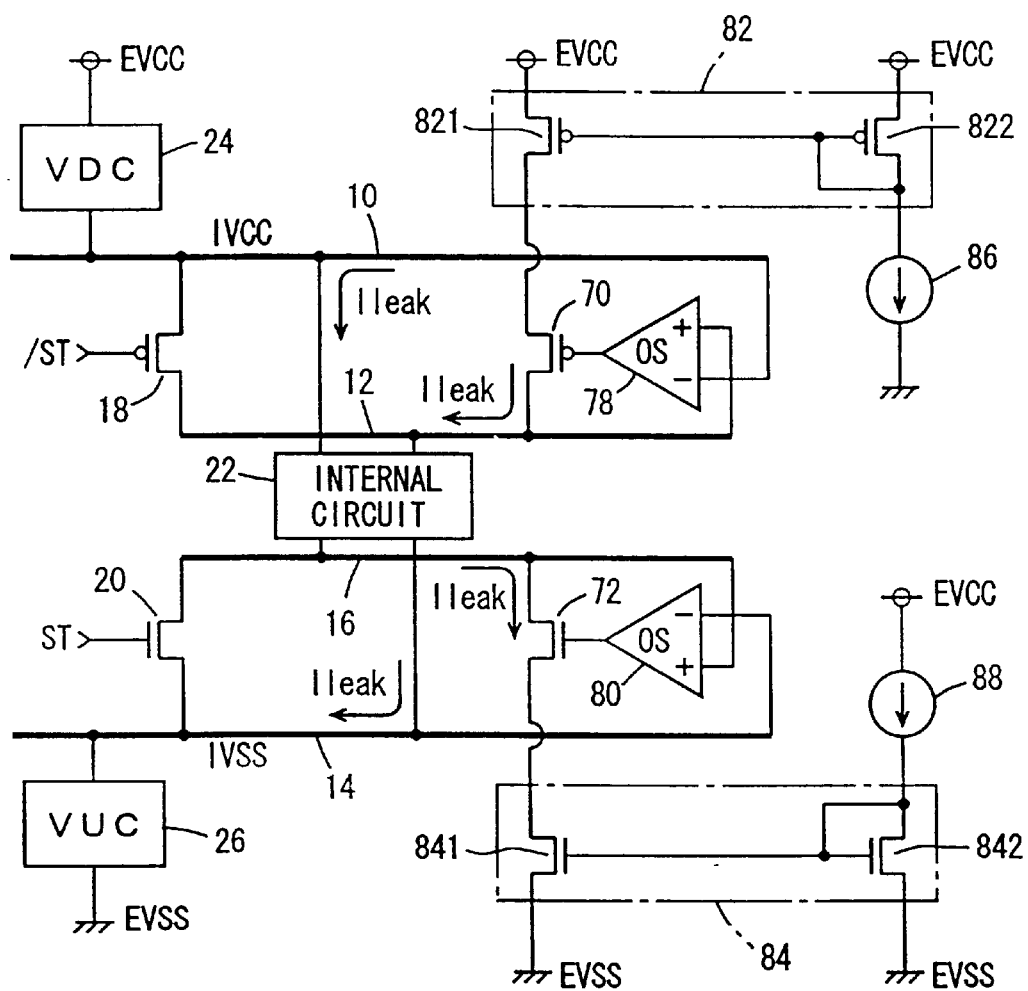
FIG. 13 is a circuit diagram showing the structure of a semiconductor circuit device according to an embodiment 4 of the present invention.

FIG. 13 is a circuit diagram showing the structure of a semiconductor circuit device according to an embodiment 4 of the present invention. Referring to FIG. 13, this semiconductor circuit device includes a current mirror circuit 82 and a current source 86 in order to supply a constant current to a sub power supply line 12, in addition to the structure shown in FIG. 12. The semiconductor circuit device further includes a current mirror circuit 84 and a current source 88 in order to supply a constant current (negative) to a sub ground line 16. However, this semiconductor circuit device includes no differential amplifiers 54 and 56, transistors 58 and 60 and resistance elements 74 and 76 shown in FIG. 12.

The current mirror circuit 82 includes a P-channel MOS transistor 821 connected to the sub power supply line 12 through a transistor 70 and a P-channel MOS transistor 822 connected to the transistor 821. The current source 86 is connected to the transistor 822. The current mirror circuit 84 includes an N-channel MOS transistor 841 connected to the sub ground line 16 through a transistor 72 and an N-channel MOS transistor 842 connected to the transistor 841. The current source 88 is connected to the transistor 842.

The current source 86 can stationarily supply a current equal to a total subthreshold leakage current flowing from the sub power supply line 12 to a main ground line 14 through an internal circuit 22. Similarly, the current source 88 can stationarily supply a current equal to a total subthreshold leakage current flowing from a main power supply line 10 to the sub ground line 16 through the internal circuit 22. A current having the same magnitude as the current source 86 flows in the transistor 821, and this current is stationarily supplied to the sub power supply line 12. A current having the same magnitude as the current source 88 flows in the transistor 841, and this current is extracted from the sub ground line 16.

According to the embodiment 4, constant currents are regularly supplied to the sub power supply line 12 and the sub ground line 16 even in a standby state, whereby leakage currents during the standby period can be controlled and the internal circuit 22 can be prevented from an operation delay in an initial stage of an active period.

Embodiment 5

Figure 14:
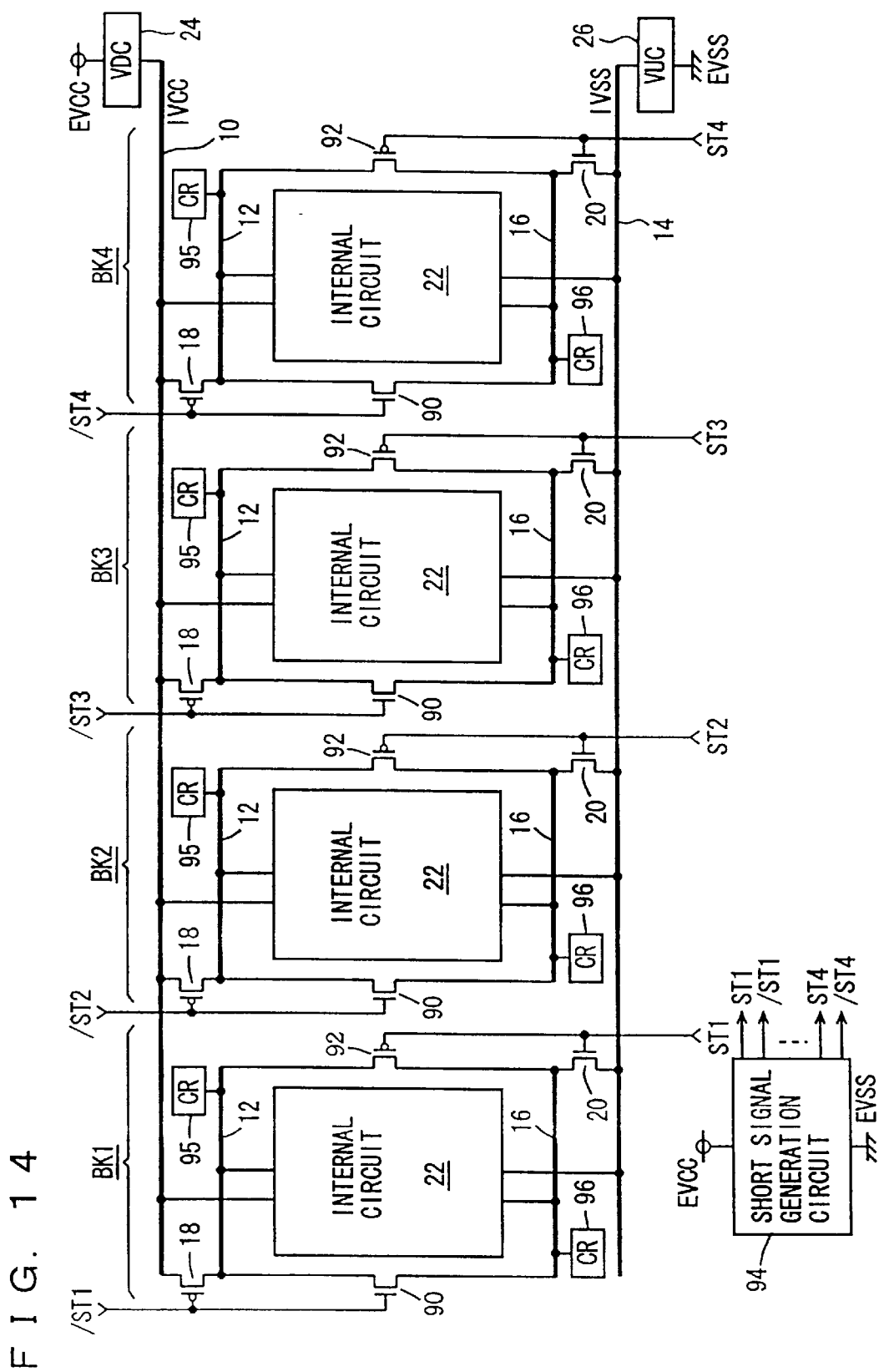
FIG. 14 is a block diagram showing the structure of a semiconductor circuit device according to an embodiment 5 of the present invention.

FIG. 14 is a circuit diagram showing the structure of a semiconductor circuit device according to an embodiment 5 of the present invention. Referring to FIG. 14, this semiconductor circuit device includes a plurality of circuit blocks BK1 to BK4. A main power supply line 10 and a main ground line 14 are provided in common for these circuit blocks BK1 to BK4. Each of the circuit blocks BK1 to BK4 includes a sub power supply line 12, a sub ground line 16, an N-channel MOS transistor 18 connected between the main power supply line 10 and the sub power supply line 12, a P-channel MOS transistor 20 connected between the main ground line 14 and the sub ground line 16, an internal circuit 22 connected between the main and sub power supply lines 10 and 12 and the main and sub ground lines 14 and 16, an N-channel MOS transistor 90 connected between the sub power supply line 12 and the sub ground line 16, and a P-channel MOS transistor 92 connected between the sub power supply line 12 and the sub ground line 16. The gate of the transistor 90 is connected to that of the transistor 18, and the gate of the transistor 92 is connected to that of the transistor 20.

A short signal generation circuit 94 in this semiconductor circuit device generates short signals ST1 to ST4 corresponding to the plurality of circuit blocks BK1 to BK4 and short signals /ST1 to /ST4 complementary thereto. The short signals ST1 to /ST4 are supplied to the gates of the transistors 18 and 90 in the circuit blocks BK1 to BK4 respectively. The short signals ST1 to ST4 are supplied to the gates of the transistors 20 and 92 in the circuit blocks BK1 to BK4 respectively.

Figure 15:
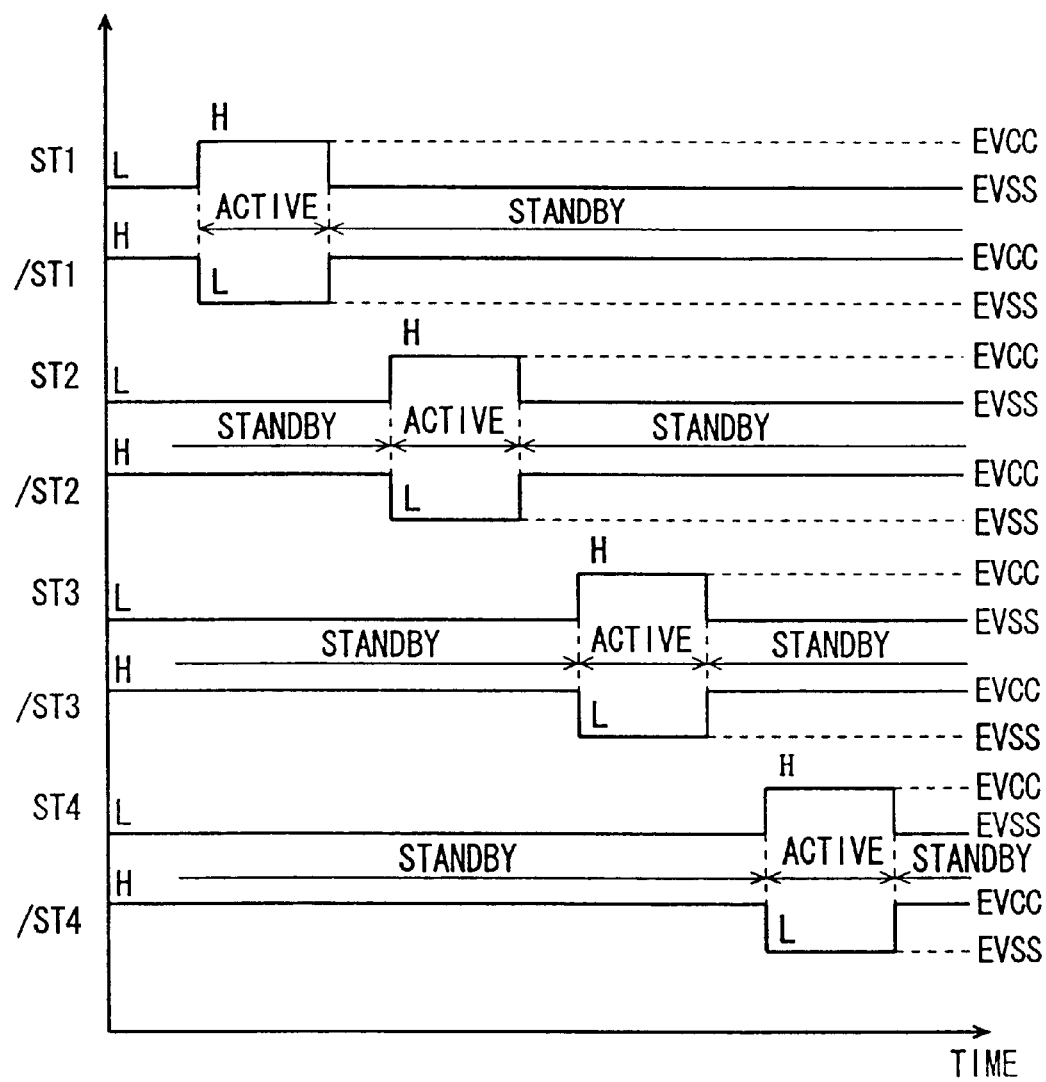
FIG. 15 is a timing chart showing operations of a short signal generation circuit shown in FIG. 14.

As shown in FIG. 15, the short signals ST1 to ST4 change to high levels in active periods and change to low levels in standby periods. The short signals /ST1 to /ST4 change complementarily to the short signals ST1 to ST4. The short signals ST1 and /ST1, ST2 and /ST2, ST3 and /ST3 and ST4 and /ST4 change independently of each other.

Each constant current circuit (CR) 95 shown in FIG. 14, disposed to supply a constant current to the sub power supply line 12, corresponds to the resistance element 52, the differential amplifier 54 and the transistor 58 shown in FIG. 1, the resistance element 74, the differential amplifier 54 and the transistor 58 shown in FIGS. 11 and 12, or the current mirror circuit 82 and the current source 86 shown in FIG. 13. Each constant current circuit (CR) 96 shown in FIG. 14, disposed to supply a constant current to the sub ground line 16, corresponds to the resistance element 50, the differential amplifier 56 and the transistor 60 shown in FIG. 1, the resistance element 76, the differential amplifier 56 and the transistor 60 shown in FIGS. 11 and 12, or the current mirror circuit 84 and the current source 88 shown in FIG. 13.

When the circuit block BK1 enters the active state and the circuit blocks BK2 to BK4 enter the standby states, for example, the short signal /ST1 goes low and the short signals /ST2 to /ST4 go high. Further, the short signal ST1 goes high and the short signals ST2 to ST4 go low. In the circuit block BK1, therefore, the transistors 18 and 20 are turned on and the transistors 90 and 92 are turned off. In the circuit blocks BK2 to BK4, on the other hand, the transistors 18 and 20 are turned off and the transistors 90 and 92 are turned on.

When the circuit block BK2 enters the active state and the circuit blocks BK1, BK3 and BK4 enter the standby states, the transistors 18 and 20 are turned on and the transistors 90 and 92 are turned off in the circuit block BK2, while the transistors 18 and 20 are turned off and the transistors 90 and 92 are turned on in the circuit blocks BK1, BK3 and BK4. The above also applies to the active state of the circuit block BK3 or BK4.

When the circuit blocks BK1 and BK2 enter the active states and the circuit blocks BK3 and BK4 enter the standby states, for example, the transistors 18 and 20 are turned on and the transistors 90 and 92 are turned off in the circuit blocks BK1 and BK2, while the transistors 18 and 20 are turned off and the transistors 90 and 92 are turned on in the circuit blocks BK3 and BK4.

In short, the transistors 18 and 20 are turned on and the transistors 90 and 92 are turned off in an active circuit block while the transistors 18 and 20 are turned off and the transistors 90 and 92 are turned on in a standby circuit block.

In the standby circuit block, the voltage of the sub power supply line 12 drops from an internal power supply voltage IVCC by discharging, while the voltage of the sub ground line 16 rises from an internal ground voltage IVSS by charging. At this time, the sub power supply line 12 and the sub ground line 16 are shorted by the transistors 90 and 92, whereby the discharge current from the sub power supply line 12 passes through the transistors 90 and 92 respectively and flows into the sub ground line 16 as a charge current.

According to the embodiment 5, as hereinabove described, the transistors 90 and 92 short the sub power supply line 12 and the sub ground line 16 in the standby state, whereby the discharge current from the sub power supply line 12 can be effectively utilized as the charge current for the sub ground line 16 for reducing current consumption While the sub power supply line and the sub ground line are provided on both of the power supply side and the ground side in each of the embodiments 1 to 5, the sub power supply line or the sub ground line can be provided only on one side.

Embodiment 6

Figure 16:
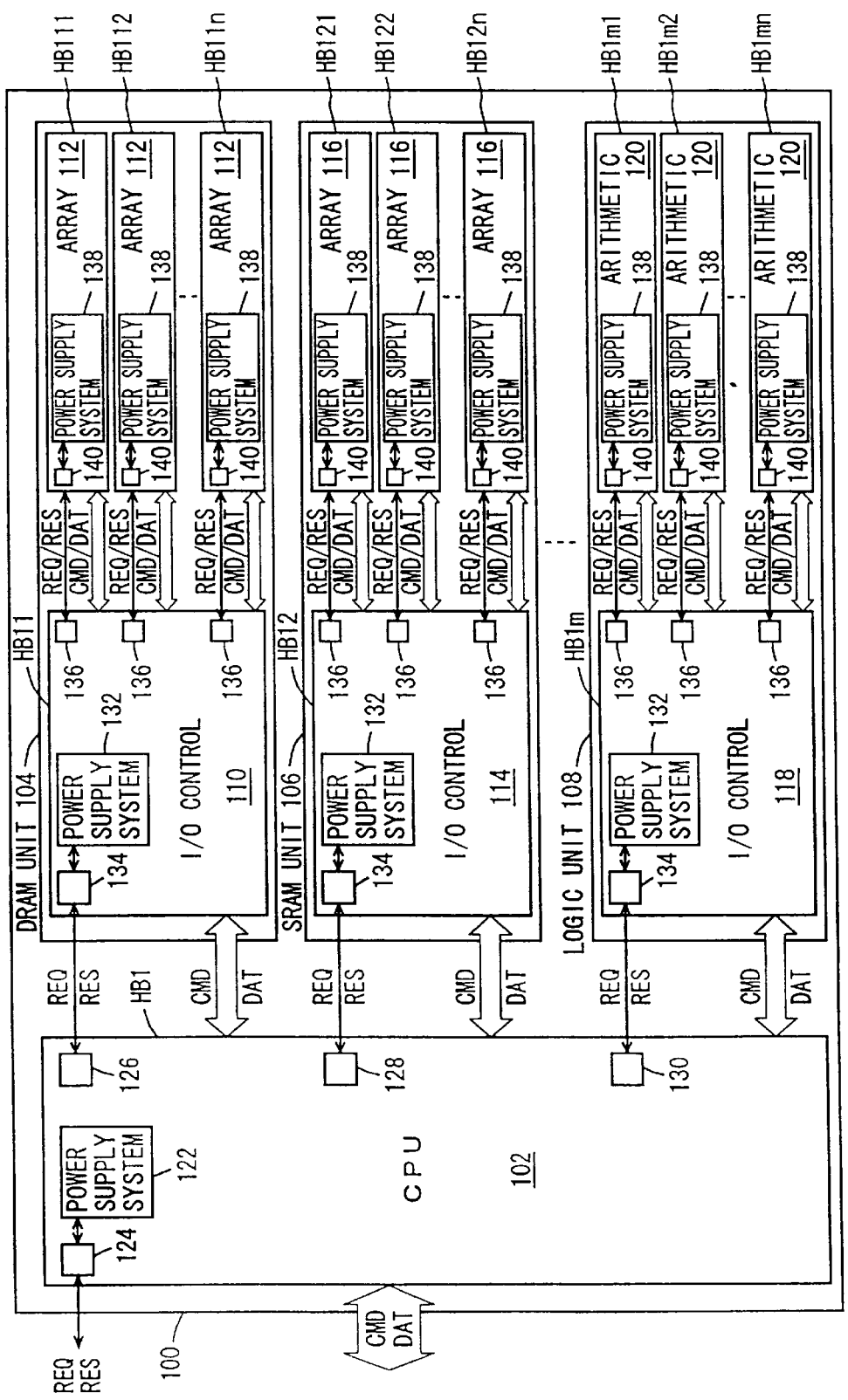
FIG. 16 is a block diagram showing the structure of a semiconductor circuit device according to an embodiment 6 of the present invention.

FIG. 16 is a block diagram showing the structure of a semiconductor circuit device according to an embodiment 6 of the present invention. Referring to FIG. 16, a memory system LSI 100 includes a CPU (central processing unit) 102, a DRAM unit 104, an SRAM unit 106, an FRAM unit (not shown), a flash memory unit (not shown), an arithmetic unit (not shown), a random logic unit 108 and an input/output unit (not shown).

The CPU 102 includes an input/output interface (not shown) for receiving a command signal CMD and a data signal DAT from an external device and supplying these signals to the external device. The CPU 102 processes the externally supplied data signal DAT in response to the externally supplied command signal CMD, and consequently supplies command signals CMD and data signals DAT to the DRAM unit 104, the SRAM unit 106 and the logic unit 108, thereby controlling these units 104, 106 and 108. The CPU 102 processes data signals DAT received from the units 104, 106 and 108 in response to command signals CMD from the units 104, 106 and 108, and consequently supplies the command signal CMD and the data signal DAT to the external device.

The DRAM unit 104 includes an input/output control circuit 110 and a plurality of dynamic memory cell arrays 112. The input/output control circuit 110 processes the data signal DAT from the CPU 102 in response to the command signal CMD from the CPU 102, and consequently supplies command signals CMD and data signals DAT to the memory cell arrays 112. The input/output control circuit 110 also processes data signals DAT from the memory cell arrays 112 in response to command signals CMD from the memory cell arrays 112, and consequently supplies the command signal CMD and the data signal DAT to the CPU 102.

The SRAM unit 106 includes an input/output control circuit 114 and a plurality of static memory cell arrays 116. The input/output control circuit 114 processes the data signal DAT from the CPU 102 in response to the command signal CMD from the CPU 102, and consequently supplies command signals CMD and data signals DAT to the memory cell arrays 116. The input/output control circuit 114 also processes data signals DAT from the memory cell arrays 116 in response to command signals CMD from the memory cell arrays 116, and consequently supplies the command signal CMD and the data signal DAT to the CPU 102.

The random logic unit 108 includes an input/output control circuit 118 and a plurality of arithmetic circuits 120. The input/output control circuit 118 processes the data signal DAT from the CPU 102 in response to the command signal CMD from the CPU 102, and consequently supplies command signals CMD and data signals DAT to the arithmetic circuits 120. The input/output control circuit 118 also processes data signals DAT from the arithmetic circuits 120 in response to command signals CMD from the arithmetic circuits 120, and consequently supplies the command signal CMD and the data signal DAT to the CPU 102.

Namely, the system LSI 100 is split into a first hierarchical block HB1, a plurality of second hierarchical blocks HB11 to HB1m, and a plurality of third hierarchical blocks HB111 to HB11n, HB121 to HB12n and HB1m1 to HB1mn.

The CPU 102 includes a power supply system 122 for supplying a prescribed voltage to an internal circuit, a receiving circuit 124 and a plurality of transmission circuits 126, 128 and 130 disposed in correspondence to the plurality of second hierarchical blocks HB 11 to HB1m. The receiving circuit 124 receives an external access request signal REQ and responsively activates the power supply system 122. When the power supply system 122 is enabled to supply the prescribed voltage, the receiving circuit 124 returns a response signal RES to the external device and posts the external device that the command signal CMD and the data signal DAT are receivable. When the DRAM unit 104 is selected as a result of processing by the internal circuit of the CPU 102, the transmission circuit 126 transmits an access request signal REQ to the input/output control circuit 110. When the SRAM unit 106 is selected, the transmission circuit 128 transmits an access request signal REQ to the input/output unit 114. When the logic unit 108 is selected, the transmission circuit 130 transmits an access request signal REQ to the input/output control circuit 118.

The input/output control circuit 110 includes a power supply system 132 for supplying a prescribed voltage to an internal circuit, a receiving circuit 134 and transmission circuits 136. The receiving circuit 134 receives the access request signal REQ from the transmission circuit 126 and responsively activates the power supply system 132. When the power supply system 132 is enabled to supply the prescribed voltage, the receiving circuit 134 returns a response signal RES to the transmission circuit 126 and posts the CPU 102 that the command signal CMD and the data signal DAT are receivable. When the transmission circuit 126 receives the response signal RES, the CPU 102 supplies the command signal CMD and the data signal DAT to the input/output control circuit 110. Each transmission circuit 136 transmits an access request signal REQ to the corresponding memory cell array 112 in response to a result of processing by the internal circuit of the input/output control circuit 110. The input/output control circuits 114 and 118 have structures similar to the above.

Each memory cell array 112 includes a power supply system 138 for supplying a prescribed voltage to its internal circuit and a receiving circuit 140. The receiving circuit 140 receives the access request signal REQ from the transmission circuit 136 and responsively activates the power supply system 138. When the power supply system 138 is enabled to supply the prescribed voltage, the receiving circuit 140 returns a response signal RES to the transmission circuit 136 and posts the input/output control circuit 110 that the command signal CMD and the data signal DAT are receivable. When the transmission circuit 136 receives the response signal RES, the input/output control circuit 110 supplies the command signal CMD and the data signal DAT to the memory cell array 112. The memory cell array 116 and the arithmetic circuit 120 have structures similar to the above.

Figure 17:
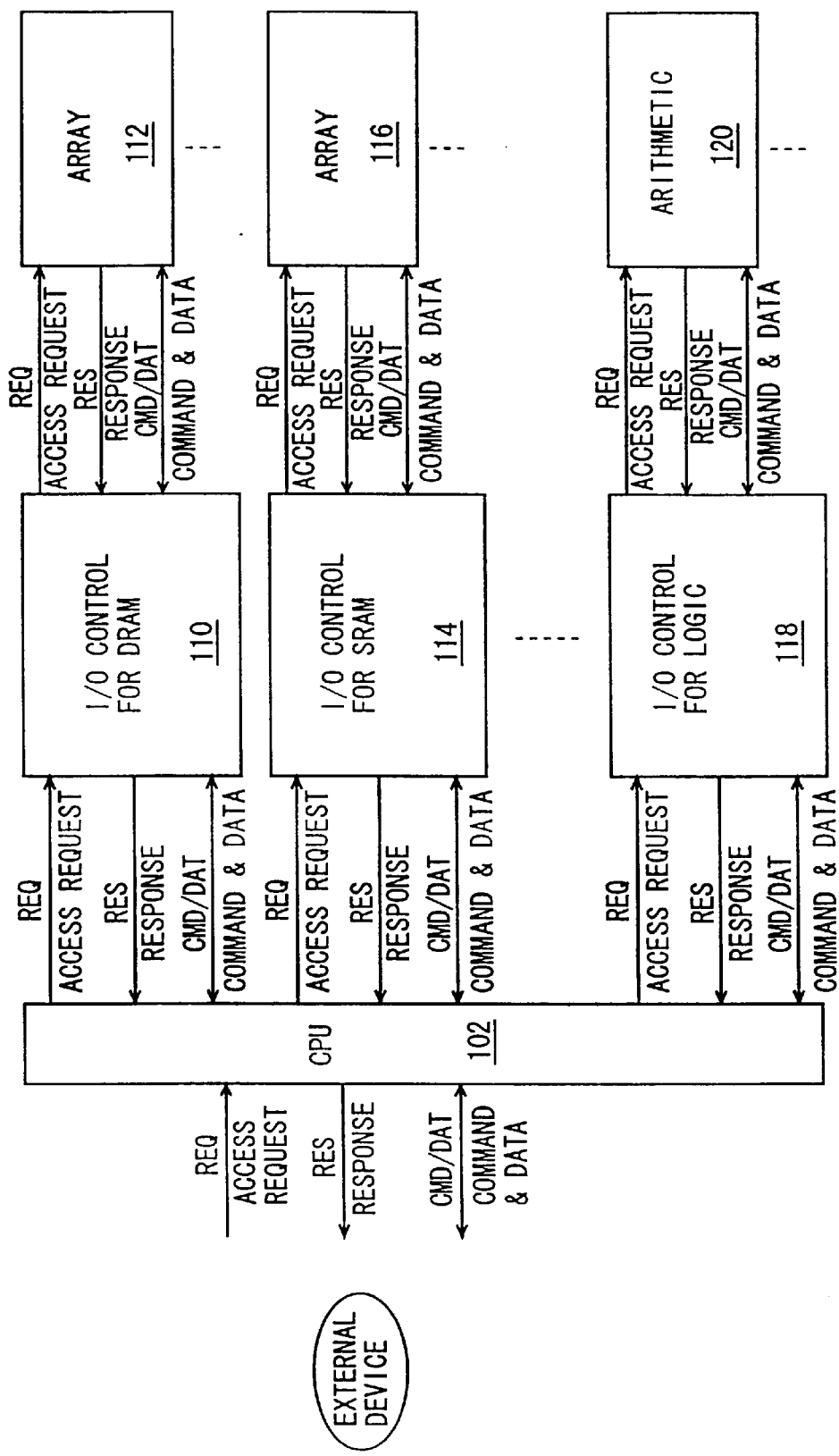
FIG. 17 is a block diagram showing operations of the semiconductor circuit device shown in FIG. 16.

Operations of the system LSI 100 having the aforementioned structure are now described with reference to FIG. 17.

When the access request signal REQ is inputted in the CPU 102 from the external device, the receiving circuit 124 in the CPU 102 activates the power supply system 122, and outputs the response signal RES to the external device when the power supply system 122 is activated. When a desired command signal CMD and a desired data signal DAT are thereafter inputted in the CPU 102 from the external device, the CPU 102 decodes the command signal CMD so that any of the transmission circuits 126, 128 and 130 in the CPU 102 transmits the access request signal REQ to the corresponding input/output control circuit in accordance with the decoded result. When the command signal CMD inputted in the CPU 102 requests reading or writing for the DRAM unit 104, the transmission circuit 126 transmits the access request signal REQ to the receiving circuit 134 in the DRAM unit 104.

The receiving circuit 134 activates the power supply system 132 when receiving the access request signal REQ, and returns the response signal RES to the transmission circuit 126 when the power supply system 132 is activated. When the transmission circuit 126 receives the response signal RES, the CPU 102 supplies the externally inputted command signal CMD or an internally generated command signal CMD to the input/output control circuit 110 while supplying the externally inputted data signal DAT or a data signal DAT resulting from arithmetic processing to the input/output control circuit 110. The input/output control circuit 110 decodes the command signal CMD, and any transmission circuit 136 transmits the access request signal REQ to the corresponding memory cell array 112 in accordance with the decoded result.

The receiving circuit 140 in the memory cell array 112 activates the power supply system 138 when receiving the access request signal REQ, and returns the response signal RES to the transmission circuit 136 when the power supply system 138 is activated. When the transmission circuit 136 receives the response signal RES, the input/output control circuit 110 supplies the command signal CMD from the CPU 102 or an internally generated command signal CMD to the memory cell array 112 while supplying the data signal DAT from the CPU 102 or a data signal DAT resulting from processing to the memory cell array 112. The memory cell array 112 processes the data signal DAT in accordance with the command signal CMD. The memory cell array 112 returns the data signal DAT resulting from the processing to the input/output control circuit 110, and simultaneously inactivates the response signal RES. If the receiving circuit 140 receives no access request signal REQ after a lapse of a prescribed time from completion of the data processing in the memory cell array 112, the power supply system 138 is inactivated.

The input/output control circuit 110 processes the data signal DAT from the memory cell array 112 and returns the data signal DAT resulting from processing thereof to the CPU 102 while simultaneously inactivating the response signal RES. If the receiving circuit 134 receives no access request signal REQ after a lapse of a prescribed time from completion of the data processing in the input/output control circuit 110, the power supply system 132 is inactivated.

The CPU 102 processes the data signal DAT from the input/output control circuit 110 and returns the data signal DAT resulting from the processing to the external device while simultaneously inactivating the response signal RES. If the receiving circuit 124 receives no access request signal REQ after a lapse of a prescribed time from completion of the data processing in the CPU 102, the power supply system 122 is inactivated.

While the DRAM unit 104 is selected in the above description, the system LSI 100 similarly operates also when the SRAM unit 106 or the logic unit 108 is selected.

In short, the system LSI 100, employing a handshaking hierarchical power supply structure, successively activates the power supply systems 122, 132 and 138 in the order of the first hierarchical block HB1, the second hierarchical blocks HB11 to HB1m and the third hierarchical blocks HB111 to HB11n, HB121 to HB12n and HB1m1 to HB1mn when starting the operations. When ending the operations, on the other hand, the system LSI 100 successively inactivates the power supply systems 138, 132 and 122 in the order of the third hierarchical blocks HB111 to HB11n, HB121 to HB12n and HB1m1 to HB1mn, the second hierarchical blocks HB11 to HB1m and the first hierarchical block HB1.

EXAMPLES OF TRANSMISSION CIRCUIT AND RECEIVING CIRCUIT

Figure 18:
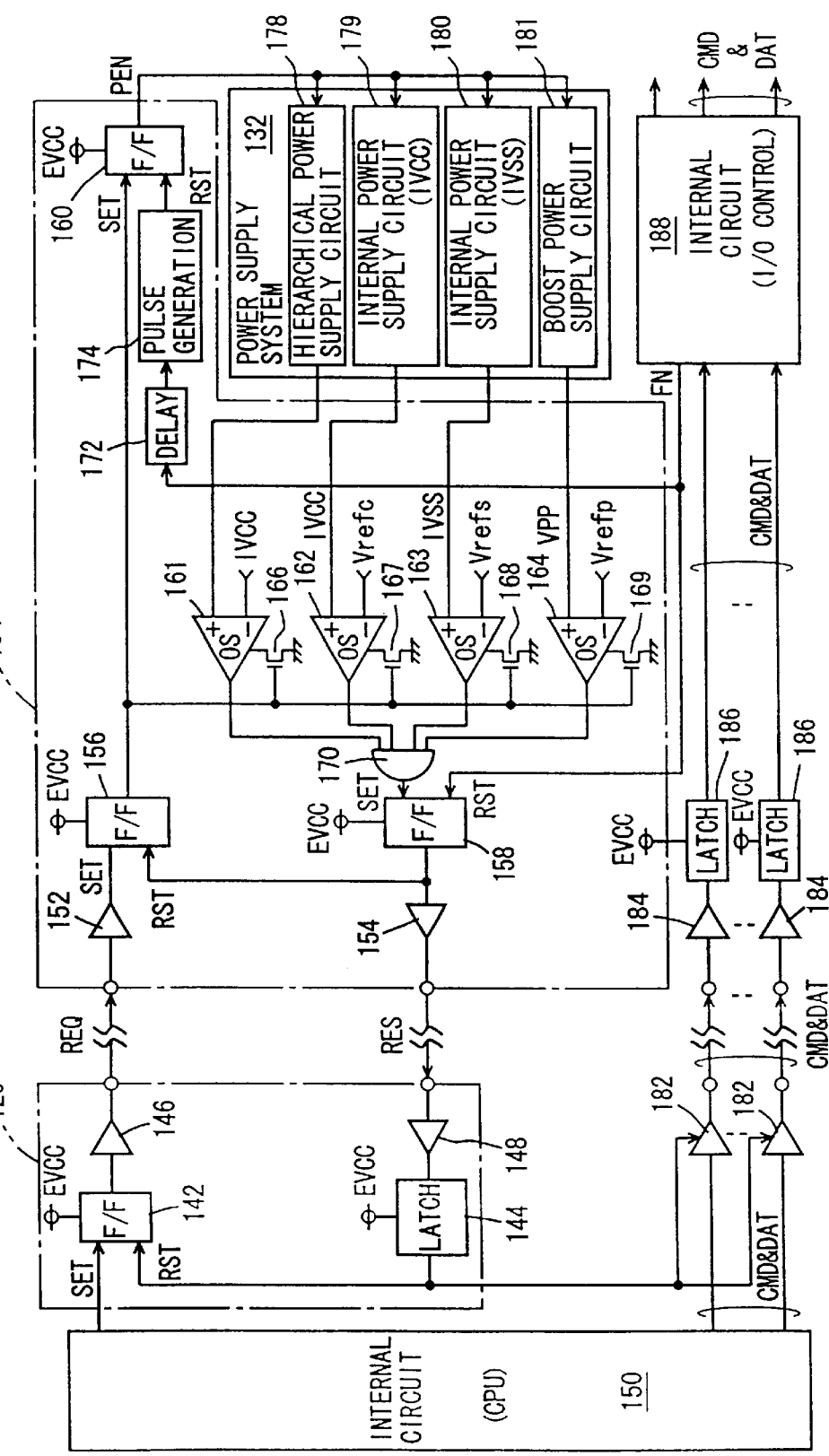
FIG. 18 is a circuit diagram showing the structures of a transmission circuit and a receiving circuit shown in FIG. 16.

FIG. 18 is a circuit diagram showing examples of the transmission circuit 126 and each receiving circuit 134 shown in FIG. 16. The remaining transmission circuits 128, 130 and 136 and receiving circuits 124 and 140 have similar structures.

Referring to FIG. 18, the transmission circuit 126 includes a flip-flop circuit (F/F) 142, a latch circuit 144 and drivers 146 and 148. When an internal circuit 150 of the CPU 102 decodes the externally supplied command signal CMD and consequently recognizes an access request for the DRAM unit 104, a set signal SET is supplied to the flip-flop circuit 142. The latch circuit 144 latches a response signal RES passing through the driver 148. An output signal of the latch circuit 144 is supplied to the flip-flop circuit 142 as a reset signal RST. An output signal of the flip-flop circuit 142 is supplied to the receiving circuit 134 through the driver 146 as the access request signal REQ.

The receiving circuit 134 includes drivers 152 and 154, flip-flop circuits 156, 158 and 160, a plurality of differential amplifiers 161 to 164 having offset voltages, N-channel MOS transistors 166 to 169 and an AND gate 170.

The access request signal REQ is supplied to the flip-flop circuit 156 through the driver 152 as a set signal SET. An output signal of the flip-flop circuit 158 is supplied to the flip-flop circuit 156 as a reset signal RST. An output signal of the flip-flop circuit 156 is supplied to the flip-flop circuit 160 as a set signal SET. An output signal of the flip-flop circuit 160 is supplied to the power supply system 132 as a power enable signal PEN, to responsively activate the power supply system 132.

The power supply system 132 includes a hierarchical power supply circuit 178 such as the circuit device according to any of the embodiments 1 to 5, an internal power supply circuit 179 such as the aforementioned voltage down convertor 24 generating an internal power supply voltage IVCC on the basis of an external power supply voltage EVCC, an internal power supply circuit 180 such as the aforementioned voltage up convertor 26 generating an internal ground voltage IVSS on the basis of an external ground voltage EVSS, and a boost power supply circuit 181 generating a boosted power supply voltage VPP higher than the external power supply voltage EVCC or the internal power supply voltage IVCC employed for driving a word line in the memory cell array 112.

The differential amplifier 161 compares the voltage of a sub power supply line supplied from the hierarchical power supply circuit 178 with the internal power supply voltage IVCC and outputs a high-level signal when the former reaches the latter. The differential amplifier 162 compares the internal power supply voltage IVCC from the internal power supply circuit 179 with a reference voltage Vrefc, and outputs a high-level signal when the former reaches the latter. The differential amplifier 163 compares the internal ground voltage IVSS from the internal power supply circuit 180 with a reference voltage Vrefs, and outputs a high-level signal when the former reaches the latter. The differential amplifier 164 compares the step-up voltage VPP from the boost power supply circuit 181 with a reference voltage Vrefp, and outputs a high-level signal when the former reaches the latter. When the flip-flop circuit 156 outputs a high-level signal, the transistors 166 to 169 are turned on to activate the differential amplifiers 161 to 164.

The AND gate 170 receives the output signals of the differential amplifiers 161 to 164, and outputs an AND signal thereof. In other words, the AND gate 170 outputs a high-level signal when all power supply circuits 178 to 181 are ready. The output signal of the AND gate 170 is supplied to the flip-flop circuit 158 as a set signal SET. The output signal of the flip-flop circuit 158 is supplied to the transmission circuit 126 through the driver 154 as the response signal RES in addition to the flip-flop circuit 156, as described above.

An internal circuit 188 of each input/output control circuit outputs an end signal FN when completing its operations. This end signal FN is supplied to a delay circuit 172, and also supplied to the flip-flop circuit 158 as a reset signal RST. The delay circuit 172 delays the end signal FN by a prescribed period and supplies the delayed signal FN to a pulse generation circuit 174. The pulse generation circuit 174 generates a pulse signal having a prescribed width in response to the delayed end signal FN. This pulse signal is supplied to the flip-flop circuit 160 as a reset signal RST.

The CPU 102 shown in FIG. 16 further includes a plurality of drivers 182, as shown in FIG. 18. Each driver 182 is activated in response to the output signal of the latch circuit 144, and supplies a command signal CMD and a data signal DAT from the internal circuit 150 to each input/output control circuit shown in FIG. 16. Each input/output control circuit further includes a plurality of drivers 184 and a plurality of latch circuits 186, as shown in FIG. 18. The command signal CMD and the data signal DAT from the CPU 102 are supplied to each latch circuit 186 through each driver 184. The command signal CMD and the data signal DAT latched by the latch circuit 186 are supplied to the internal circuit 188 in the input/output control circuit. The internal circuit 188 decodes the command signal CMD, and generates a command signal CMD and processes the data signal DAT in accordance with the decoded result.

Operations of the transmission circuit 126 and the receiving circuit 134 having the aforementioned structures are now described.

When the internal circuit 150 of the CPU 102 receives a command signal CMD indicating a read or write request for the DRAM unit 104 shown in FIG. 16, the flip-flop circuit 142 is set in response to the set signal SET. Consequently, the transmission circuit 126 supplies a high-level access request signal REQ to the receiving circuit 134. Thus, the flip-flop circuit 156 is set in response to the set signal SET. Thus, the flip-flop circuit 156 is set in response to the set signal SET, while the differential amplifiers 161 to 164 are activated.

When the flip-flop circuit 160 is set, the power supply system 132 is activated. More specifically, the hierarchical power supply circuit 178, the internal power supply circuit 179, the internal power supply circuit 180 and the boost power supply circuit 181 are activated. When the voltage of the sub power supply line reaches the internal power supply voltage IVCC in the hierarchical power supply circuit 178, the differential amplifier 161 supplies a high-level output signal to the AND gate 170. When the internal power supply voltage IVCC reaches the reference voltage Vrefc in the internal power supply circuit 179, the differential amplifier 162 supplies a high-level output signal to the AND gate 170. When the internal ground voltage IVSS reaches the reference voltage Vrefs in the internal power supply circuit 180, the differential amplifier 163 supplies a high-level output signal to the AND gate 170. When the step-up voltage VPP reaches the reference voltage Vrefp in the boost power supply circuit 181, the differential amplifier 164 supplies a high-level signal to the AND gate 170.

When all output signals of the differential amplifiers 161 to 164 go high, the flip-flop circuit 158 is set in response to the set signal SET. Consequently, the receiving circuit 134 supplies a high-level response signal RES to the transmission circuit 126.

The latch circuit 144 latches the high-level response signal RES, thereby activating all drivers 182. Consequently, the CPU 102 supplies the command signal CMD and the data signal DAT to the input/output control circuit. The latch circuit 186 latches the command signal CMD and the data signal DAT, which in turn are supplied to the internal circuit 188 in the input/output control circuit.

When the flip-flop circuit 158 in the receiving circuit 134 is set, on the other hand, the flip-flop circuit 156 is reset. Thus, the transistors 166 to 169 are supplied with a low-level output signal, thereby inactivating the differential amplifiers 161 to 164. However, the flip-flop circuit 160 maintains a set state and hence the power supply system 132 maintains an active state.

When the internal circuit 188 completes its operations, the end signal FN is supplied to the delay circuit 172 and the flip-flop circuit 158. Thus, the response signal RES goes high and all drivers 182 are inactivated. Consequently, the CPU 102 is inhibited from transmitting the command signal CMD and the data signal DAT to the input/output control circuit.

The delay circuit 172 delays the end signal FN and supplies the delayed end signal FN to the pulse generation circuit 174, and hence the reset signal RST is supplied to the flip-flop circuit 160 after a lapse of a prescribed period from generation of the end signal FN. The flip-flop circuit 160 is reset unless the flip-flop circuit 156 is set in response to a high-level access request signal REQ before the reset signal RST is supplied to the flip-flop circuit 160. Consequently, the power supply system 132 is inactivated. If the flip-flop circuit 156 is set again in response to a high-level access request signal REQ after generation of the end signal FN and before generation of the pulse signal by the pulse generation circuit 174, on the contrary, the flip-flop circuit 160 maintains a set state and the power supply system 132 maintains an active state as a result.

Thus, the power supply system 132 is not immediately inactivated after the internal circuit 188 completes its operations, whereby the internal circuit 188 can immediately start its operations when the receiving circuit 134 receives an access request signal REQ immediately after the internal circuit 188 completes its operations.

According to the embodiment 6, as hereinabove described, the power supply systems are so hierarchically structured that only necessary power supply systems are successively activated upward from below while no unnecessary power supply systems are activated, whereby power consumption can be reduced.

After confirming a response signal indicating activation of a power supply system in a lower hierarchy, the command signal CMD and the data signal DAT are supplied from the current hierarchy to the lower hierarchy so that these signals CMD and DAT can be reliably processed.

The power supply system is inactivated after a lapse of a prescribed period from completion of the operations of the internal circuit. When an access request signal REQ is received again immediately after completion of the operations of the internal circuit, therefore, the internal circuit can quickly start its operations.

Transmission /receiving in the embodiment 6 may be executed between different chips or on a single chip on the system.

Embodiment 7

The transmission circuit and the receiving circuit according to the embodiment 6 are slightly complicated in circuit structure due to the handshaking system. Accordingly, an embodiment 7 of the present invention is aimed at simplifying circuit structures of a transmission circuit and a receiving circuit.

In the transmission circuit according to the embodiment 7, an internal circuit starts its operations after a lapse of a prescribed period from transmission of an access request signal REQ without waiting for return of a response signal. On the other hand, the receiving circuit immediately activates a power supply system when receiving the access request signal REQ.

Figure 19:
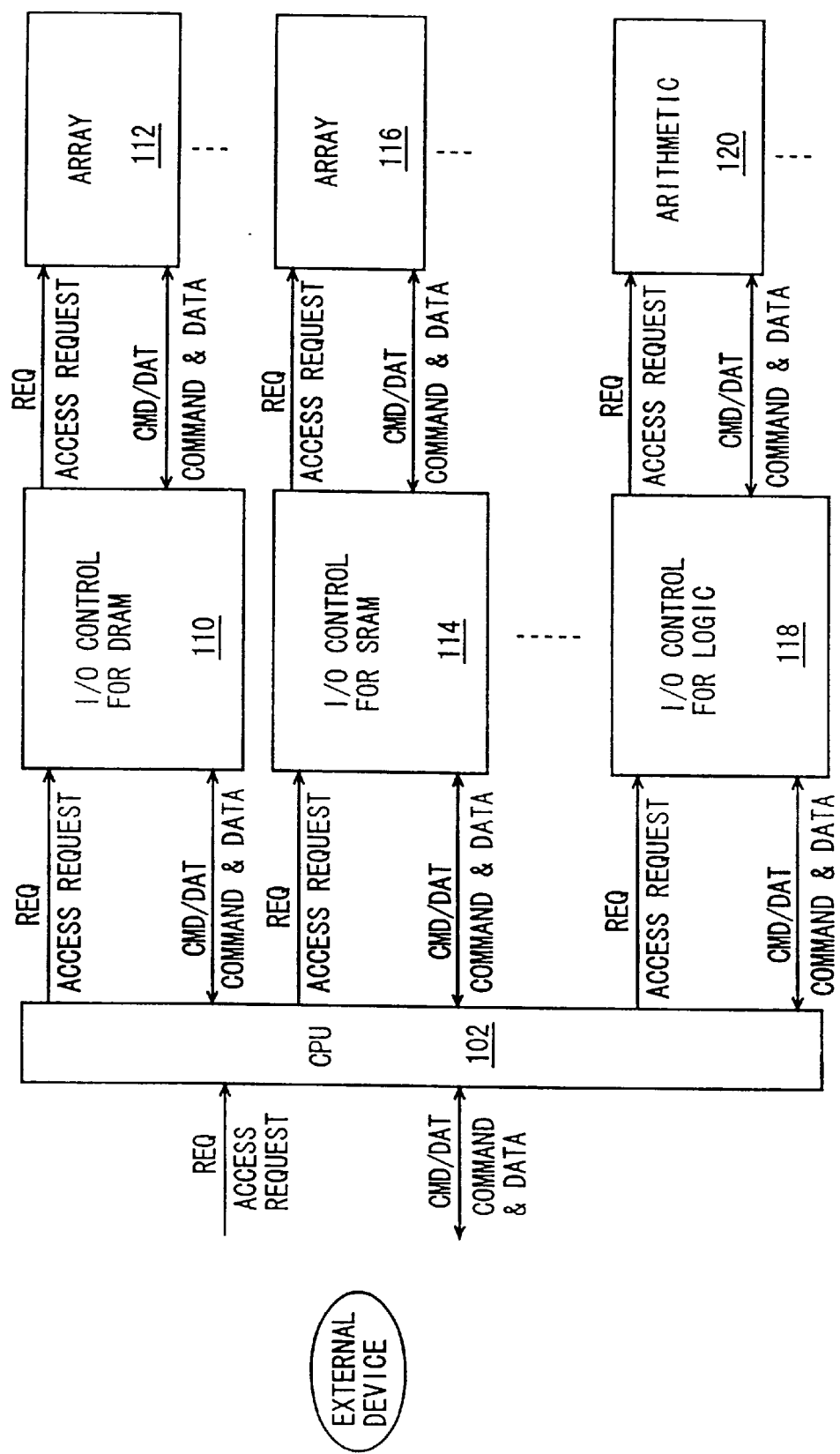
FIG. 19 is a block diagram showing operations of a semiconductor circuit device according to an embodiment 7 of the present invention.

Operations of a system LSI according to the embodiment 7 are now described with reference to FIG. 19.

When an access request signal REQ is externally supplied, a receiving circuit in a CPU 102 activates a power supply system in the CPU 102. After a lapse of a prescribed period from input of the access request signal REQ, a command signal CMD and a data signal DAT are externally supplied to the CPU 102. A time required for completely setting the power supply system after receiving the access request signal REQ is set as the prescribed period.

If the command signal CMD requests reading or writing for a DRAM unit, the CPU 102 supplies an access request signal REQ to an input/output control circuit 110 in the DRAM unit. In response to the access request signal REQ, a receiving circuit in the input/output control circuit 110 activates a power supply system in the input/output control circuit 110. After a lapse of a prescribed period from the transmission of the access request signal REQ from the CPU 102 to the input/output control circuit 110, the CPU 102 supplies a command signal CMD and a data signal DAT to the input/output control circuit 110.

Then, a transmission circuit in the input/output control circuit 110 supplies an access request signal REQ to a memory cell array 112. In response to the access request signal REQ, a receiving circuit in the memory cell array 112 activates a power supply system in the memory cell array 112. After a lapse of a prescribed period from the transmission of the access request signal REQ from the input/output control circuit 110 to the memory cell array 112, the input/output control circuit 110 supplies a command signal CMD and a data signal DAT to the memory cell array 112.

Also when an SRAM unit or a logic unit is selected, operations similar to the above are performed.

EXAMPLES OF TRANSMISSION CIRCUIT AND RECEIVING CIRCUIT

Figure 20:
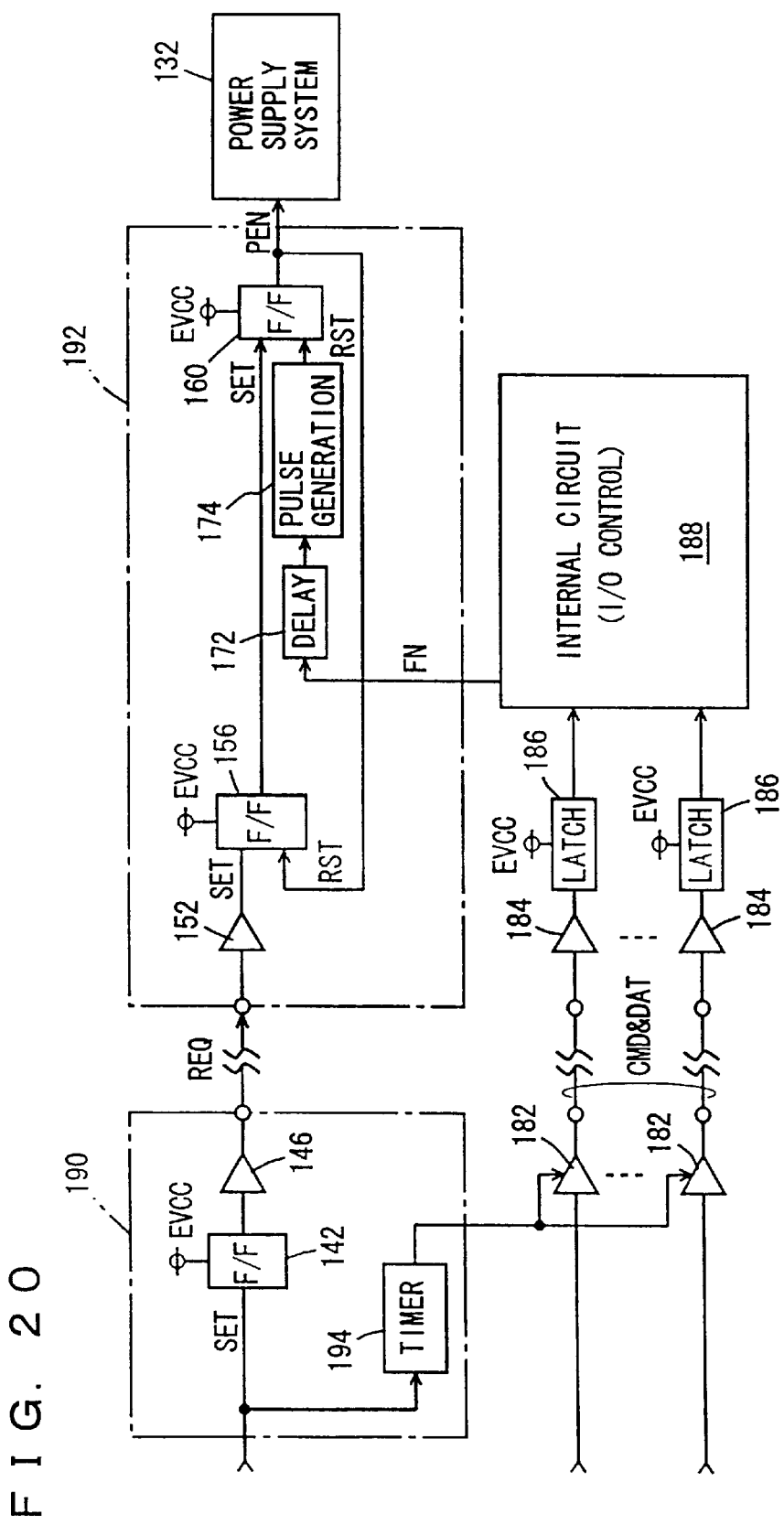
FIG. 20 is a circuit diagram showing the structures of a transmission circuit and a receiving circuit in the semiconductor circuit device shown in FIG. 19.

FIG. 20 is a block diagram showing the structures of a transmission circuit 190 and a receiving circuit 192 according to the embodiment 7. Referring to FIG. 20, the transmission circuit 190 includes a timer 194, in addition to the structure shown in FIG. 18. This transmission circuit 190, receiving no response signal, includes no latch circuit 144 and driver 148 shown in FIG. 18.

The timer 194 outputs a high-level signal when a prescribed period elapses after the internal circuit in the CPU 102 sets a flip-flop circuit 142. An output signal of the timer 194 is supplied to a plurality of drivers 182 in the CPU 102.

The receiving circuit 192, generating no response signal, includes no differential amplifiers 161 to 164, transistors 166 to 169, AND gate 170, flip-flop circuit 158 and driver 154 shown in FIG. 18. An output signal of a flip-flop circuit 160 is supplied to a flip-flop circuit 156 as a reset signal RST.

When the flip-flop circuit 142 is set in such structures of the transmission circuit 190 and the receiving circuit 192, the transmission circuit 190 transmits an access request signal REQ to the receiving circuit 192, while the timer 194 simultaneously starts counting the time.

When the receiving circuit 192 receives the access request signal REQ, the flip-flop circuit 156 is set similarly to the above, and then the flip-flop circuit 160 is set. Thus, a power supply system 132 is activated.

When the power supply system 132 supplies a prescribed voltage to an internal circuit 188 to render the internal circuit 188 operable, an output signal of the timer 194 goes high to activate the drivers 182. Thus, the command signal CMD and the data signal DAT are transmitted from the CPU 102 to the input/output control circuit 110 and supplied to the internal circuit 188 through the drivers 184 and latch circuits 186.

Similarly to the above, a delay circuit 172 delays an end signal FN when the internal circuit 188 completes its operations, and supplies the delayed end signal FN to a pulse generation circuit 174. Therefore, the flip-flop circuit 160 is reset after a lapse of a prescribed period from completion of the operations of the internal circuit 188. When the receiving circuit 192 receives an access request signal REQ again during this period, however, the flip-flop circuit 160 maintains a set state. Consequently, the power supply system 132 maintains an active state if the access request signal REQ is intermittently transmitted.

According to the embodiment 7, as hereinabove described, no response signal may be generated and received, whereby the transmission circuit 190 and the receiving circuit 192 are simplified in circuit structure. Nonetheless the timer 194 delays transmission of the command signal CMD and the data signal DAT, whereby the internal circuit 188 can receive the command signal CMD and the data signal DAT after the power supply system 132 is sufficiently activated.

Transmission/receiving in the embodiment 7 may be executed between different chips or on a single chip on the system.

DETAILS OF POWER SUPPLY SYSTEM

The power supply system 132 in each of the embodiments 6 and 7 includes the hierarchical power supply circuit 178, the internal power supply circuit 179, the internal power supply circuit 180 and the boost power supply circuit 181, as shown in FIG. 18.

In the hierarchical power supply circuit 178, the power enable signal PEN from the flip-flop circuit 160 shown in FIG. 18 or 20 is supplied to a short signal generation circuit 28 such as that shown in FIG. 1, so that short signals ST and /ST are activated in response to the power enable signal PEN.

Figure 21:
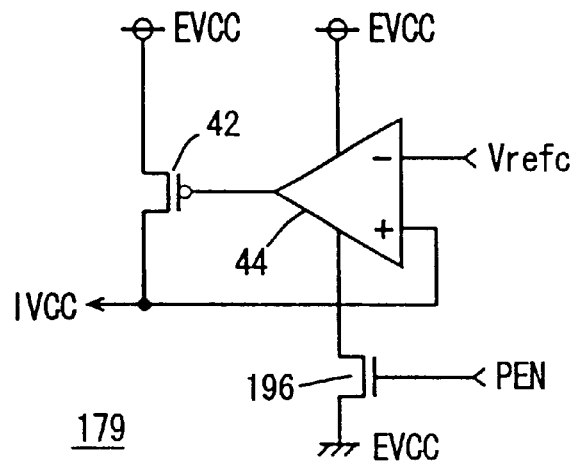
FIG. 21 is a circuit diagram showing an example of a power supply system shown in FIGS. 16, 18 and 20.

In the internal power supply circuit 179 generating the internal power supply voltage IVCC on the basis of the external power supply voltage EVCC, an N-channel MOS transistor 196 is connected to a ground side of a differential amplifier 44 as shown in FIG. 21, and a power enable signal PEN is supplied to its gate. The transistor 196 is turned on in response to the power enable signal PEN, thereby activating the differential amplifier 44. Consequently, the differential amplifier 44 so controls a transistor 42 that the internal power supply voltage IVCC is equal to the reference voltage Vrefc.

Figure 22:
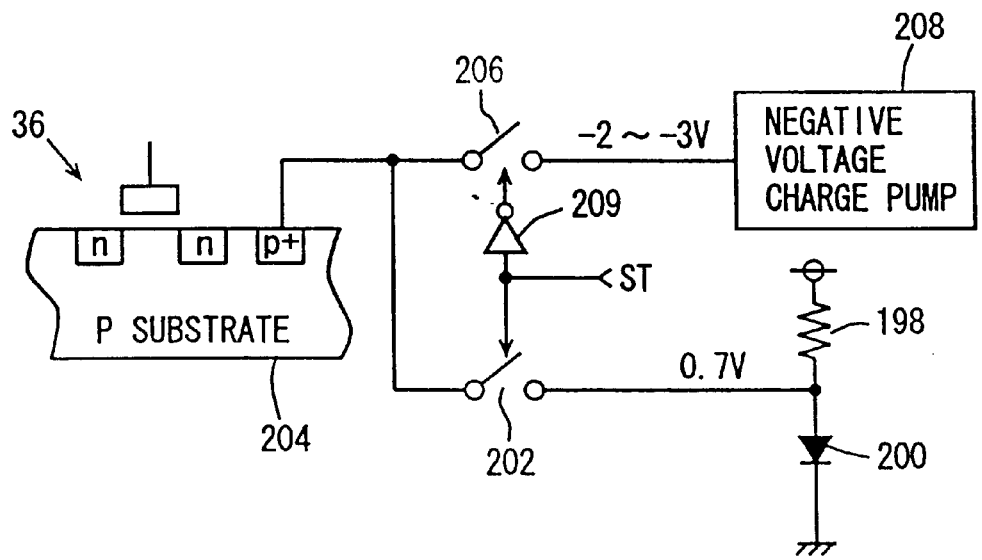
FIG. 22 is a circuit diagram showing another example of the power supply system shown in FIGS. 16, 18 and 20.

To a back gate of an N-channel MOS transistor in the aforementioned internal circuit, a source voltage or a slightly higher voltage can be applied during an active period while a negative voltage can be applied during a standby period. As shown in FIG. 22, for example, a resistance element 198 and a diode 200 are serially connected with each other for supplying a forward voltage of 0.7 V of the diode 200 to a p substrate 204 forming a back gate of the N-channel MOS transistor (36 in FIG. 1, for example) through a switching element 202. Further, a negative voltage charge pump circuit 208 generating a negative voltage of −2 to −3 V is disposed to supply the negative voltage to the p substrate 204 through a switching element 206. The switching element 202 directly receives a short signal ST, while the switching element 206 receives the short signal ST through an invertor 209. Therefore, the voltage of 0.7 V is supplied to the p substrate 204 in the active state (ST=H), while the negative voltage of −2 to −3 V is supplied to the p substrate 204 in the standby state (ST=L). Therefore, a substrate effect is reduced and the operating speed of the N-channel MOS transistor is increased in the active state. Further, the voltage 0.7 V is not in excess of a contact voltage between the p substrate 204 and an n-type diffusion region forming a source/drain region, and hence no large quantity of forward current flows in the p-n junction. In the standby state, on the other hand, the substrate effect is increased and hence a subthreshold leakage current of the N-channel MOS transistor is reduced.

As to a P-channel MOS transistor, a source voltage or a voltage slightly lower than the source voltage can be applied to its back gate during an active period while a voltage higher than the source voltage can be applied to the back gate during a standby period.

Figure 23:
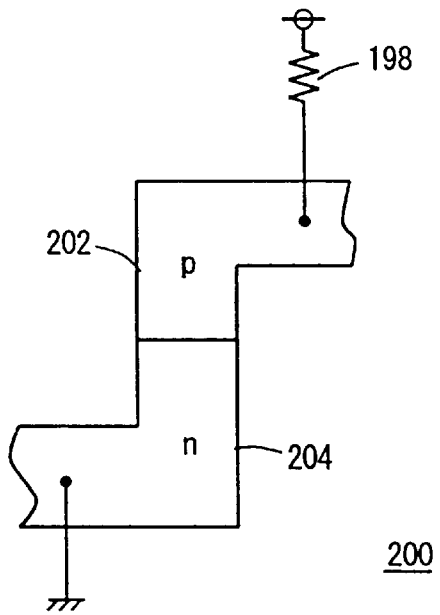
FIG. 23 is a plan view showing the structure of a diode shown in FIG. 22.

FIG. 23 is a plan view showing the structure of the diode 200 shown in FIG. 22. Referring to FIG. 23, the diode 200 is formed by a p-type region 202 and an n-type region 204. These regions 202 and 204 are formed by a single wire of polysilicon or a metal, and a p-type impurity is injected into the p-type region 202 while an n-type impurity is injected into the n-type region 204.

Figure 24:
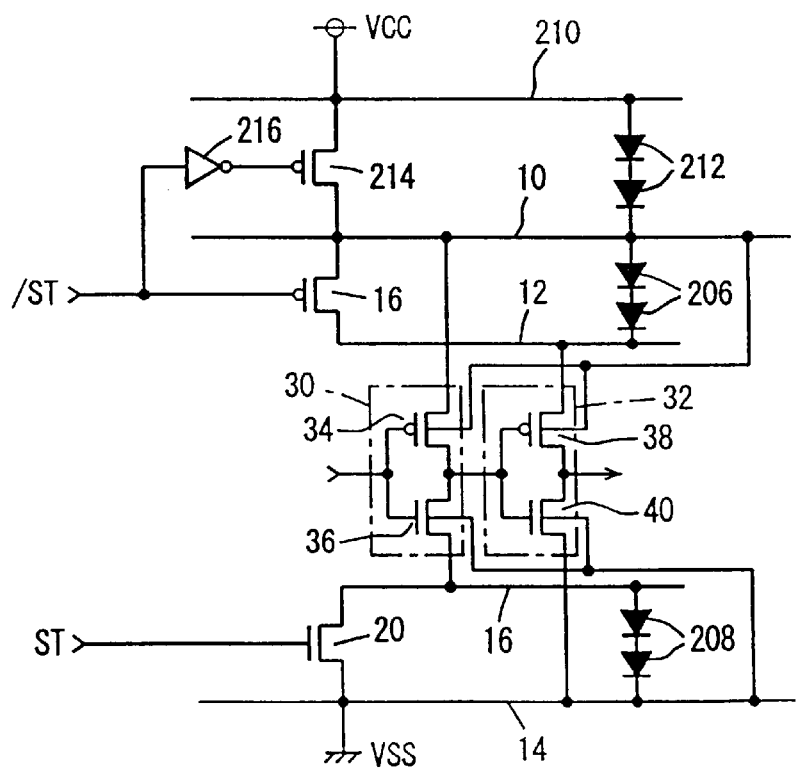
FIG. 24 is a circuit diagram showing still another example of the power supply system shown in FIGS. 16, 18 and 20.

As shown in FIG. 24, voltages identical to source voltages of transistors 34, 36, 38 and 40 can be applied to back gates thereof in an active state, and voltages higher than source voltages of P-channel MOS transistors 30 and 32 can be applied to back gates thereof while applying voltages lower than the source voltages of the N-channel MOS transistors 36 and 40 to the back gates thereof in a standby state.

Referring to FIG. 24, two diodes 206 are serially connected between a main power supply line 10 and a sub power supply line 12. Further, two diodes 208 are serially connected also between a sub ground line 16 and a main ground line 14. In addition, two diodes 212 are serially connected between a power supply line 210 receiving a power supply voltage VCC and the main power supply line 10. Further, a P-channel MOS transistor 214 is also connected between the power supply line 210 and the main power supply line 10, and turned on/off in response to a short signal/ST supplied through an invertor 216.

During the active period, the transistors 16 and 20 are turned on and the transistor 214 is turned off. Therefore, voltages identical to the source voltages of the transistors 34, 36, 38 and 40 are supplied to the back gates thereof respectively.

During the standby period, on the other hand, the transistors 16 and 20 are turned off and the transistor 214 is turned on. Therefore, a voltage VCC−Vth (Vth: threshold voltage of each diode 206) is supplied to the source of the P-channel MOS transistor 38 while the power supply voltage VCC is supplied to its back gate. Therefore, a p-n junction between a p-type diffusion region forming a source/drain and an n-type substrate forming the back gate is reverse-biased, whereby a leakage current flowing in the p-n junction is reduced. Further, a voltage VSS+2Vth (Vth: threshold voltage of each diode 208) is supplied to the source of the N-channel MOS transistor 36 and a ground voltage VSS is supplied to its back gate. Therefore, a p-n junction between a p-type substrate forming the back gate and an n-type diffusion region forming a source/drain is reverse-biased, whereby a leakage current flowing in the p-n junction is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device including a first hierarchical block and a plurality of second hierarchical blocks, said first hierarchical block including:

a first power supply system disposed to supply a voltage to an internal circuit in said first hierarchical block, a first receiving circuit disposed to receive an externally supplied first request signal and activate said first power supply system, and a plurality of transmission circuits corresponding to said plurality of second hierarchical blocks, each disposed to transmit a second request signal to corresponding said second hierarchical block, wherein said first receiving circuit returns a first response signal to an external device after said first power supply system is activated, and said internal circuit in said first hierarchical block activates/inactivates said second request signal in response to an externally supplied first command signal, each said second hierarchical block including:

a second power supply system disposed to supply a voltage to an internal circuit in said second hierarchical block, and a second receiving circuit disposed to receive said second request signal and activate said second power supply system.

2. The semiconductor circuit device according to claim 1, wherein said second receiving circuit returns a second response signal to corresponding said transmission circuit after said second power supply system is activated, and said internal circuit in said first hierarchical block supplies a second command signal to said internal circuit in corresponding said second hierarchical block when one of said transmission circuits receives said second response signal.

3. The semiconductor circuit device according to claim 1, wherein said first receiving circuit inactivates said first power supply system when not receiving said first request signal after a lapse of a prescribed period from completion of an operation of said internal circuit in said first hierarchical block, and said second receiving circuit inactivates said second power supply system when not receiving said second request signal after a lapse of a prescribed period from completion of an operation of said internal circuit in said second hierarchical block.

4. The semiconductor circuit device according to claim 1, wherein said internal circuit in said first hierarchical block transmits a command signal to said internal circuit in said second hierarchical block when a prescribed period elapses after said transmission circuit transmits said second request signal.

* * * * *